(12) United States Patent
    Leu

(10) Patent No.: US 11,719,649 B2
(45) Date of Patent: *Aug. 8, 2023

(54) METHOD FOR SMART CONVERSION AND CALIBRATION OF COORDINATE

(71) Applicant: ELITE SEMICONDUCTOR INC., Zhudong Town (TW)

(72) Inventor: Iyun Leu, Hsinchu (TW)

(73) Assignee: ELITE SEMICONDUCTOR INC., Zhudong Town (TW)

( * ) Notice: Subject to any disclaimer, the term of this patent is extended or adjusted under 35 U.S.C. 154(b) by 133 days.

This patent is subject to a terminal disclaimer.

(21) Appl. No.: 17/233,227

(22) Filed: Apr. 16, 2021

(65) Prior Publication Data

US 2021/0231580 A1    Jul. 29, 2021

Related U.S. Application Data

(63) Continuation of application No. 16/134,114, filed on Sep. 18, 2018, now Pat. No. 11,016,035, which is a continuation of application No. 62/559,784, filed on Sep. 18, 2017.

(51) Int. Cl.
| | | |
|---|---|---|
| *G01N 21/95* | (2006.01) | |
| *H01L 21/66* | (2006.01) | |
| *G06T 7/00* | (2017.01) | |
| *G01N 21/88* | (2006.01) | |
| *G06F 30/398* | (2020.01) | |
| *G06F 30/3323* | (2020.01) | |

(52) U.S. Cl.
CPC ..... *G01N 21/9501* (2013.01); *G01N 21/8851* (2013.01); *G06F 30/3323* (2020.01); *G06F 30/398* (2020.01); *G06T 7/001* (2013.01); *H01L 22/12* (2013.01); *H01L 22/20* (2013.01); *G01N 2021/8861* (2013.01); *G01N 2021/8864* (2013.01); *G01N 2021/8874* (2013.01); *G06T 2207/30148* (2013.01)

(58) Field of Classification Search
CPC .......... G01N 21/9501; G01N 21/8851; G01N 2021/8861; G01N 2021/8864; G01N 2021/8874; G06T 7/001; G06T 2207/30148; H01L 22/12

See application file for complete search history.

(56) References Cited

U.S. PATENT DOCUMENTS

| | | | |
|---|---|---|---|
| 6,284,553 B1 | 9/2001 | Steffan et al. | |
| 11,016,035 B2 * | 5/2021 | Leu ................... | G01N 21/9501 |
| 2004/0254752 A1 | 12/2004 | Wisniewski et al. | |

* cited by examiner

*Primary Examiner* — Toan M Le

(74) *Attorney, Agent, or Firm* — Muncy, Geissler, Olds & Lowe, P.C.

(57) ABSTRACT

A smart conversion and calibration of the defect coordinate, diagnosis, sampling system and the method thereof for manufacturing fab is provided. The intelligent defect diagnosis method includes receiving pluralities of defect data, design layout data, analyzing the defect data, design layouts, by a Critical Area Analysis (CAA) system. The method utilizes the precisely calibrated coordinate, the defect layout pattern, and the higher accurate calibrated defect size value. So, a more precise killer defect index can be generated with calibrated coordinate deviation calibration and defect size deviation calibration. When judging a defect relating to short circuit or open circuit failure probability, the defect failure result is more accurate and less incorrect judgment.

8 Claims, 19 Drawing Sheets

| Calibration test ID | X coordinate deviation | Y coordinate deviation |
|---|---|---|
| 1 | 0.1 | 0.2 |
| 2 | 0.14 | 0.23 |
| 3 | 0.09 | 0.18 |
| 4 | 0.11 | 0.19 |
| 5 | 0.15 | 0.27 |
| 6 | 0.07 | 0.19 |
| 7 | 0.16 | 0.26 |
| 8 | 0.12 | 0.22 |
| 9 | 0.13 | 0.26 |
| 10 | 0.06 | 0.19 |
| Average | 0.113 | 0.219 |
| std. dev. | 0.033 | 0.034 |

1150

| Defect ID | Die index | Defect coordinate (x1, y1) | Defect size (x axis) (nm) | Defect size (y axis) (nm) | Design layout coordinate (x2, y2) | Defect size after defect size calibration (x axis) (nm) | Defect size after defect size calibration (y axis) (nm) |
|---|---|---|---|---|---|---|---|
| 1 | (0, -1) | (502, 5867) | 100 | 100 | (472, 5842) | 65 | 58 |
| 2 | (0, -1) | (1065, 4279) | 150 | 200 | (1035, 4254) | 101 | 112 |
| 3 | (0, -1) | (1159, 396) | 50 | 50 | (1129, 371) | 35 | 35 |
| 4 | (0, -1) | (2354, 1355) | 150 | 150 | (2324, 1330) | 100 | 120 |
| 5 | (0, -1) | (3239, 2208) | 250 | 200 | (3209, 2183) | 161 | 102 |
| 6 | (0, -1) | (5407, 782) | 100 | 300 | (5377, 757) | 52 | 165 |
| 7 | (0, -1) | (4905, 4732) | 300 | 350 | (4875, 4705) | 183 | 21 |
| 8 | (0, 0) | (3052, 2736) | 200 | 200 | (3022, 2711) | 104 | 121 |
| ... | ... | ... | ... | ... | ... | ... | ... |

METHOD FOR SMART CONVERSION AND CALIBRATION OF COORDINATE

CROSS-REFERENCE TO RELATED APPLICATIONS

This application is a continuation application of U.S. patent application Ser. No. 16/134,114 filed on Sep. 18, 2018, which claims the benefit of U.S. Patent Application No. 62/559,784 filed on Sep. 18, 2017, the content of which are hereby incorporated by reference in their entirety.

BACKGROUND OF THE INVENTION

1. Field of the Invention

The present invention involves a smart semiconductor defect calibration, classification, and sampling system and the method thereof. Especially it is a smart defect calibration, classification, and sampling system and the method thereof applied to the semiconductor manufacturing fab, semiconductor assembly fab, flat panel display manufacturing fab, solar panel manufacturing fab, printed circuit board manufacturing fab, mask manufacturing fab, LED fab or assembly fab.

2. Description of the Prior Art

In general, the manufacturing of integrated circuit wafer in a semiconductor fab includes processing with mask, lithography process, etching (plasma etch and wet etch), film deposition, Cu dual damascene process, chemical mechanical polishing, and multi-patterning exposure processes and equipment. During the manufacturing stage, the random defect and systematic defect are normally created due to such factors as the equipment's precision deviation itself, abnormal failure, particle created in the process, insufficient process window in the design layout and lithography process matrix window check. Those random defect and systematic defect will cause product's open or short failure. Reduce the wafer yield. Following semiconductor technology geometry shrinkage, the random defect and systematic defect will increase in large quantity with shrinkage geometry dimension. Each time, there are several thousand, or several ten thousand defects detected in defect scan and inspection. Because the defect processing throughput is limited by the defect images throughput taken from Scanning Electron Microscope. Fab team can only select a small number of defect images (for example: 50 to 200 defect images) for each defect inspection test. That makes defect sample selection of real open circuit failure defect or short circuit failure defect extremely difficult. Normally, real open circuit failure defect or short circuit failure defect SEM images cannot be found in time to process engineer or the SEM images are useless without failure. So, process engineer can hardly judge where the root cause of wafer yield failure is based on the SEM images. The defect yield improvement efficiency is poor. This will increase semiconductor fab cost.

In the past, the real-time data mining of defect and image pattern classification data is an important method adopted to increase yield in the operation of a semiconductor fab (for example: Foundry fab). But it becomes very hard to identify failure killer defect for the previous method in the nanometer semiconductor fab process. The core part of this invention introduces integrated circuit (IC) design layout data, Critical Area Analysis (CAA) method, defect pattern overlapping design layout pattern, defect to design layout coordinate conversion calibration system, and defect size calibration system. Those method and system are important breakthrough to solve the killer defect sampling issue.

Furthermore, there is defect size deviation issue between the defect contour's metrology data measured on the defect image pattern which is generated from the SEM and optical microscope and defect data generated from the defect inspection tool. The Critical Area Analysis is compared with both defect sizes as an input defect size. Because the defect size, area deviation exists between defect data generated from the defect inspection tool and the defect contour's metrology data measured on the defect image pattern which is generated from the SEM and optical microscope. That makes deviation on the Critical Area Analysis result. In order to resolve the Critical Area Analysis deviation, the defect size deviation issue must be solved. For example: The defect size metrology unit of the defect inspection tool is obviously higher than the minimum size unit of design layout pattern. That will result in the defect size deviation issue between the defect size of the defect inspection data and the real defect size data of the SEM image.

Besides, design layout pattern geometry size keeps on shrinking in more advanced complex semiconductor process. Especially, lithography process window is getting narrower when optical limitation effect is getting worse. That becomes worse when the IC design layout polygon counts are increased in multiple times and layout patterns are drawn in more complex mode. So, some defects are related to certain design layout patterns which are detected from systematic defect inspection. Those defects that will impact yield are so-called systematic defect. It will cause very low yield. But there are defect layout patterns which do not impact IC design circuits, for example: monitor layout patterns. Those defects will not impact yield. They belong to false defect. Usually, those false defects' pattern and signal are obviously stronger than other defects. So, those false defects normally occupy the majority of defect sample quantities up to 90% level. That blocks the opportunity to find out the real open failure or short failure defect pattern.

In defect sampling part, the same inventor with U.S. Pat. No. 8,312,401B2 granted in 2012 uses Critical Area Analysis method to calculate the critical area over defect location's design layout pattern area based on the defect size and the coordinate deviation region area. A Killer Defect Index (KDI) is calculated to assess the defect's open circuit failure or short circuit failure probability. This is the Killer Defect Index, i.e. a CAA value. However, it does not count on the resolution of defect inspection tool. Especially, the layout pattern geometry dimension is smaller than the resolution dimension of defect inspection tool. For example: The resolution unit is +−w for a defect inspection tool. For example: When w is equal to 0.05 μm, the reported defect size dimension will be in multiple time of 0.05 μm. If the layout pattern geometry dimension is 0.02 μm, then the reported defect size would be larger than real defect size. This defect size deviation will result in incorrect KDI value, i.e. higher KDI value than real KDI value.

Based on consideration of the above-mentioned multiple technologies, how to overcome the above constraints to raise and improve the manufacturing efficiency of semiconductor fab is the common goal of the engineers and experts in the defect analysis field.

SUMMARY OF THE INVENTION

The main purpose of the invention is to use the integrated circuit (IC) design layout and Critical Area Analysis method.

In terms of the deviation value generated from the defect inspection tool, this invention provides input the coordinate deviation calibration value and the calibration factor for the defect size that can correct the coordinate deviation and defect size deviation of the defect data from the defect inspection tool. Combining the integrated circuit design layout data, the system overlaps the plurality of defect pattern onto the mapped plurality of defect layout pattern one by one. Then, the system analyzes with Critical Area Analysis method to create the Killer Defect Index (KDI). This invention utilizes the precisely calibrated coordinate, the defect layout pattern, and the higher accurate calibrated defect size value. So, a more precise killer defect index can be generated with calibrated coordinate deviation calibration and defect size deviation calibration. When judging a defect relating to short circuit or open circuit failure probability, the defect failure result is more accurate and less incorrect judgment. This new invention will become an important tool that can identify a defect belonging to a killer defect category or a non-killer defect category.

According to the purpose mentioned above, this invention provides a coordinate conversion and calibration system in semiconductor wafer manufacturing. The system includes a storage apparatus, wafer manufacturing equipment, defect inspection tool, and data processing apparatus. The storage apparatus is used to store the IC design layout files. The IC design layout file includes plurality of circuit pattern. Wafer manufacturing equipment processes the circuit pattern layout of the IC design layout onto wafer. The wafer defect inspection tool scans and inspects the wafer to report defect inspection data. Data processing apparatus converts the defect scan and inspection data into a defect text data and image data and store onto the storage apparatus. The characteristics is: Data processing apparatus retrieves a calibration value, i.e. retrieves a calibration value from the storage apparatus. The calibration value is the relative coordinate calibration statistical value of the coordinate deviation area when applies to the conversion of defect image coordinate to the defect layout pattern coordinate.

Main purpose of the invention is to provide a method for smart conversion and calibration of coordinate by means of a coordinate conversion and calibration system including a data processing apparatus and a storage apparatus, the method comprises following steps: providing an integrated circuit design layout file, the integrated circuit design layout file has a plurality of circuit layout patterns and is stored into the storage apparatus; processing a wafer fabrication process, the semiconductor manufacturing fab forms the plurality of circuit layout patterns on the wafer according to the integrated circuit design layout file; processing a wafer defect scan and inspection by a defect inspection tool to obtain a defect inspection data, the data processing apparatus transforms the defect inspection data into a defect text and image data file and stores into the storage apparatus, wherein the defect text and image data file includes a plurality of defect data on the wafer, and each of the defect data at least includes a defect coordinate, a defect size, a defect area and a defect intensity value of a defect contour; retrieving an original coordinate, an alignment reference coordinate, and a dimension unit data of the circuit layout pattern and the defect inspection tool from the storage apparatus; adjusting dimension units of the defect size, a defect coordinate and the circuit layout pattern to be the same dimension unit by the data processing apparatus; converting the defect contour onto a correct defect coordinate $(X_2, Y_2)$ of the circuit layout pattern for a real-time pattern match by the data processing apparatus; executing a coordinate deviation calibration by the data processing apparatus, which includes: obtaining a coordinate deviation calibration value $(X_2'-X_2, Y_2'-Y_2)$ by the data processing apparatus, the coordinate deviation calibration value $(X_2'-X_2, Y_2'-Y_2)$ includes an average coordinate precision value and a coordinate precision standard deviation value for X-axis and Y-axis, the average coordinate precision value and the coordinate precision standard deviation value are calculated via a statistical analysis; and introducing the average coordinate precision value and the coordinate precision standard deviation value into the coordinate conversion and calibration system in order to overlap or map a defect coordinate $(X_1, Y_1)$ to a new coordinate location $(X_2', Y_2')$ based on the coordinate deviation calibration value $(X_2'-X_2, Y_2'-Y_2)$ after the coordinate deviation calibration.

Based on the purpose mentioned above, the invention further provides a method for smart conversion and calibration of coordinate by means of a coordinate conversion and calibration system including a data processing apparatus and a storage apparatus, the method comprises following steps: providing an integrated circuit design layout file, the integrated circuit design layout file has a plurality of circuit layout patterns and is stored into the storage apparatus; processing a wafer fabrication process, the semiconductor manufacturing fab forms the plurality of circuit layout patterns on the wafer according to the integrated circuit design layout file; processing a wafer defect scan and inspection by a defect inspection tool to obtain a defect inspection data, the data processing apparatus transforms the defect inspection data into a defect text and image data file and stores into the storage apparatus, wherein the defect text and image data file includes a plurality of defect data on the wafer, and each of the defect data at least includes a defect coordinate, a defect size, a defect area and a defect intensity value of a defect contour; retrieving an original coordinate, an alignment reference coordinate, and a dimension unit data of a mask, the circuit layout pattern and the defect inspection tool from the storage apparatus; adjusting dimension units of the defect size, the defect coordinate, the mask and the circuit layout pattern to be the same dimension unit by the data processing apparatus; converting the defect contour onto a correct defect coordinate $(X_2, Y_2)$ of the circuit layout pattern for a real-time pattern match by the data processing apparatus; executing a coordinate deviation calibration by the data processing apparatus, which includes: obtaining a coordinate deviation calibration value $(X_2'-X_2, Y_2'-Y_2)$ by the data processing apparatus, the coordinate deviation calibration value $(X_2'-X_2, Y_2'-Y_2)$ includes an average coordinate precision value and a coordinate precision standard deviation value for X-axis and Y-axis, the average coordinate precision value and the coordinate precision standard deviation value are calculated via a statistical analysis; and introducing the average coordinate precision value and the coordinate precision standard deviation value into the coordinate conversion and calibration system in order to overlap or map a defect coordinate $(X_1, Y_1)$ to a new coordinate location $(X_2', Y_2')$ based on the coordinate deviation calibration value $(X_2'-X_2, Y_2'-Y_2)$ after the coordinate deviation calibration.

DETAILED DESCRIPTION OF THE INVENTION

In semiconductor wafer fab, semiconductor assembly fab, flat panel display fab, solar panel fab, printed circuit board fab, mask fab, LED fab or LED assembly fab, there must be run through mask, lithography, etching, and film deposition, etc. equipment and processing method to form a specific functioning product. Because there are many complex process steps in the manufacturing procedures, the process and equipment parameter control, equipment parameter shift, or technical bottleneck can produce the defects that would impact yield. Generation of those defects is inevitable. So, in the manufacturing procedures of a semiconductor fab, fab team would always execute defect inspection and analysis to improve yield and reduce cost.

Figure 1:
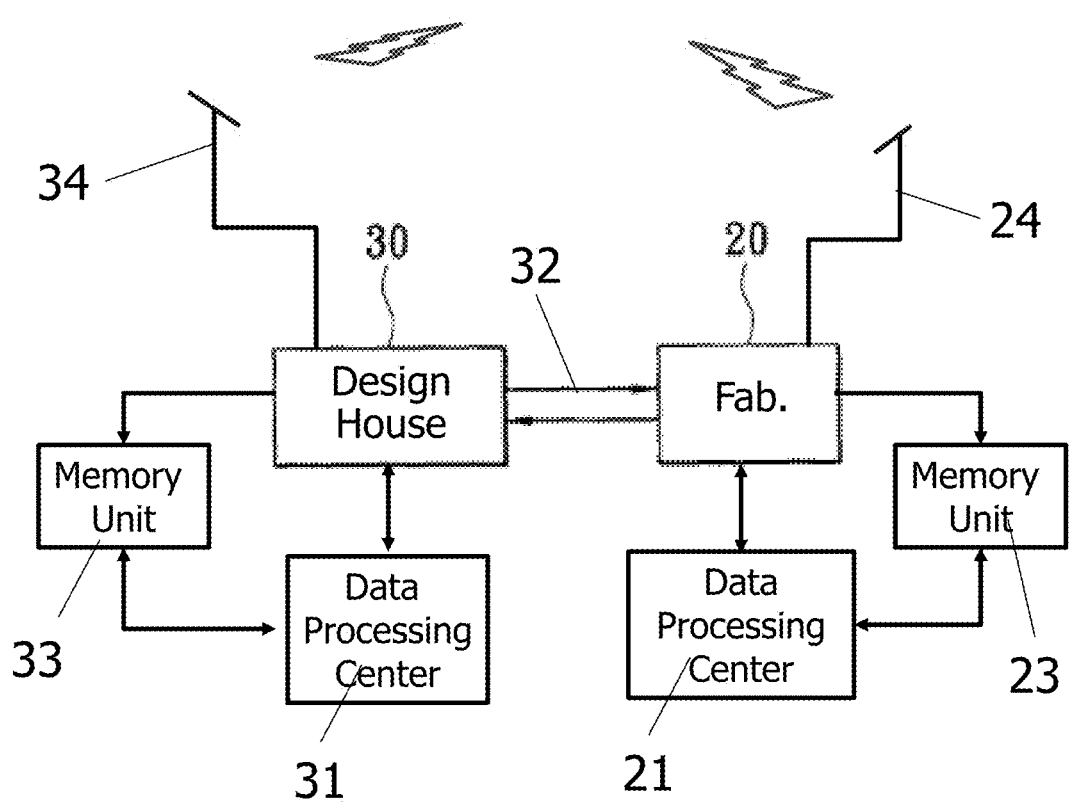
FIG. 1 is the operation architecture drawing chart of the smart semiconductor defect calibration, classification, and sampling system and the method thereof of the present invention.

First of all, please review FIG. 1. It is an operation architecture chart for the present invention that involves a smart semiconductor defect calibration, classification, and sampling system and the method thereof. As shown in FIG. 1, a practice example of the present invention will take the wafer manufacturing as an example and explain as well. For the description procedure below, we will use smart system to replace smart defect calibration system and the method thereof. Overall, the smart system can be implemented at wafer foundry fab 20 (a simple naming as fab 20). The smart system can be implemented at IC design house 30 (a simple naming as design house 30). Of course, the smart system can be implemented through fab 20 and design house 30 via wired internet or through antenna 24/34 and wireless internet to implement.

For example: When a design house 30 completes a specific functioning IC design layout, data processing center 31 will store the design layout pattern GDS or OASIS file into the memory unit 33. Then, the system will deliver the GDS or OASIS file through wired internet or wireless internet to fab 20. The design layout pattern 1110 (shown in FIG. 3A) include plurality of layout pattern (i.e. device layout pattern). Each layout pattern polygon always includes layout pattern geometry size, layout pattern coordinate, layout pattern layer, text mark or dimension. In general, design layout pattern 1110 format can be GDS (Graphic Database System) format, GDS-II format, or OASIS (Open Access Same-time Information System) format. Fab 20 retrieve the data file and pass data file to data processing center 21. Once data processing center 21 processes the data file, the data will be saved into the memory unit 23. The mask is made based on the design layout file and OPC (Optical Proximity Correction) in mask house. After that, fab 20 will run semiconductor process using various layer's mask. Then, plurality of repeating die 11 (shown in FIG. 3D) are made in wafer 10. Usually, fab 20 will use the design house 30 design layout file to manufacture semiconductor chips.

During the manufacturing procedures of wafer 10, defect will occur in each manufacturing process of wafer 10. For example, random defect or systematic defect. That is why fab 20 will use defect inspection tool to detect defect at any stage or multiple process steps in the manufacturing process. For example: Scanning Electron Microscope (SEM), E-beam inspection tool, optical inspection tool, defect scanner, or camera, etc. The defect inspection tool will run defect scan and inspection on wafer 10 and generate the wafer's raw defect inspection data file. The defect inspection file includes defect size dimension, shape, area, die index, coordinate, or image, etc. The defect data will be processed in the Data Processing Center 21 to be JPG, TIFF, PNG, and pure text spec defect text and image data file 1130 (shown in FIG. 3B). Then, save into the memory unit 23.

Based on the above information, fab 20 obviously has saved the design layout file 1110 of a design house 30, defect text and image data file 1130 into memory unit 23. So, Smart System of present invention can execute defect calibration, classification, and sampling job at fab 20. Similarly, Smart System of present invention can execute defect calibration, classification, and sampling job at design house 30 if fab 20 delivers defect text and image file 1130 to design house 30 through wired network or wireless network. Of course, Smart System of present invention can execute defect calibration, classification, and sampling job as a real-time analysis for both fab 20 and design house 30 if both fab 20 and design house 30 can exchange data files to each other real-time through wired network or wireless network. As to who is in charge to execute defect calibration, classification, and sampling job, the present invention does not limit to either side.

Figure 2:
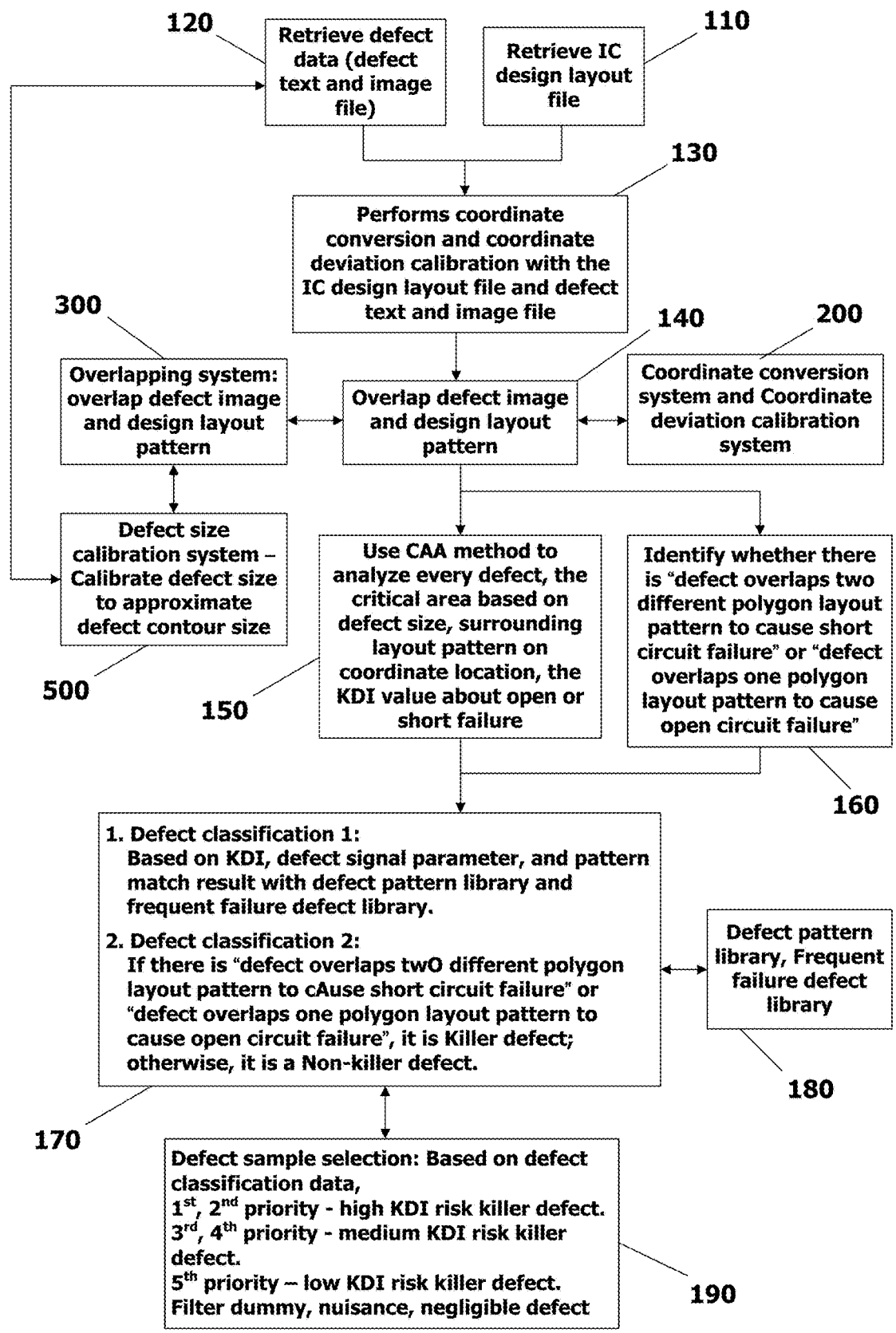
FIG. 2 is the process flowchart of the smart system of the present invention.

Next, please refer to FIG. 2. It is the flowchart of the smart system of the present invention. As shown in FIG. 2, flowchart 100 of smart system of the present invention begins with data processing center 21. Data processing center 21 retrieves design layout pattern file 1110 and defect text and image data file 1130 as shown in step 110 and step 120. Then, step 130 performs coordinate conversion and coordinate deviation calibration with the design layout pattern file 1110 and defect text and image data file 1130. The defect coordinate location of wafer 10 is converted to the corresponding coordinate location in design layout pattern. It is to decide where the defect image 1101 will fall on the design layout pattern coordinate location. After that, step 140 processes each defect contour of the defect image to be superposed or mapped to design layout pattern 1110 where the superposition or mapping location is the mapping defect layout pattern 1111 coordinate location with coordinate conversion from each defect image 1101 coordinate location. Then, step 150 generates Killer Defect Index (KDI). Killer Defect Index is generated based on step 140 the defect pattern coordinate conversion of each defect image's contour to be superposed or mapped in design layout coordinate location. The Critical Area Analysis method is used to analyze and produce the short and open critical area based on the defect contour dimension and the layout pattern with a coordinate deviation area at the design layout coordinate location. At same time, step 160 can check whether there is overlap of defect image contour with two layout patterns. Step 160 can also check whether there is intersect of defect image contour with one layout pattern. Then, step 170 performs defect classification based on the judgment results of step 150 and step 160. According to the KDI, defect signal parameter, pattern match between defect and defect pattern library, and pattern match between defect and frequent failure defect library, defect classification is performed. The defect pattern library and frequent failure defect library can be obtained from memory unit 23/33 (as shown in step 180), or process defect classification based on the layout pattern interaction with defect, i.e. the short or open failure result. Finally, step 190 performs defect sampling based on the defect classification and defect sampling rule setup in step 170.

Figure 3A:
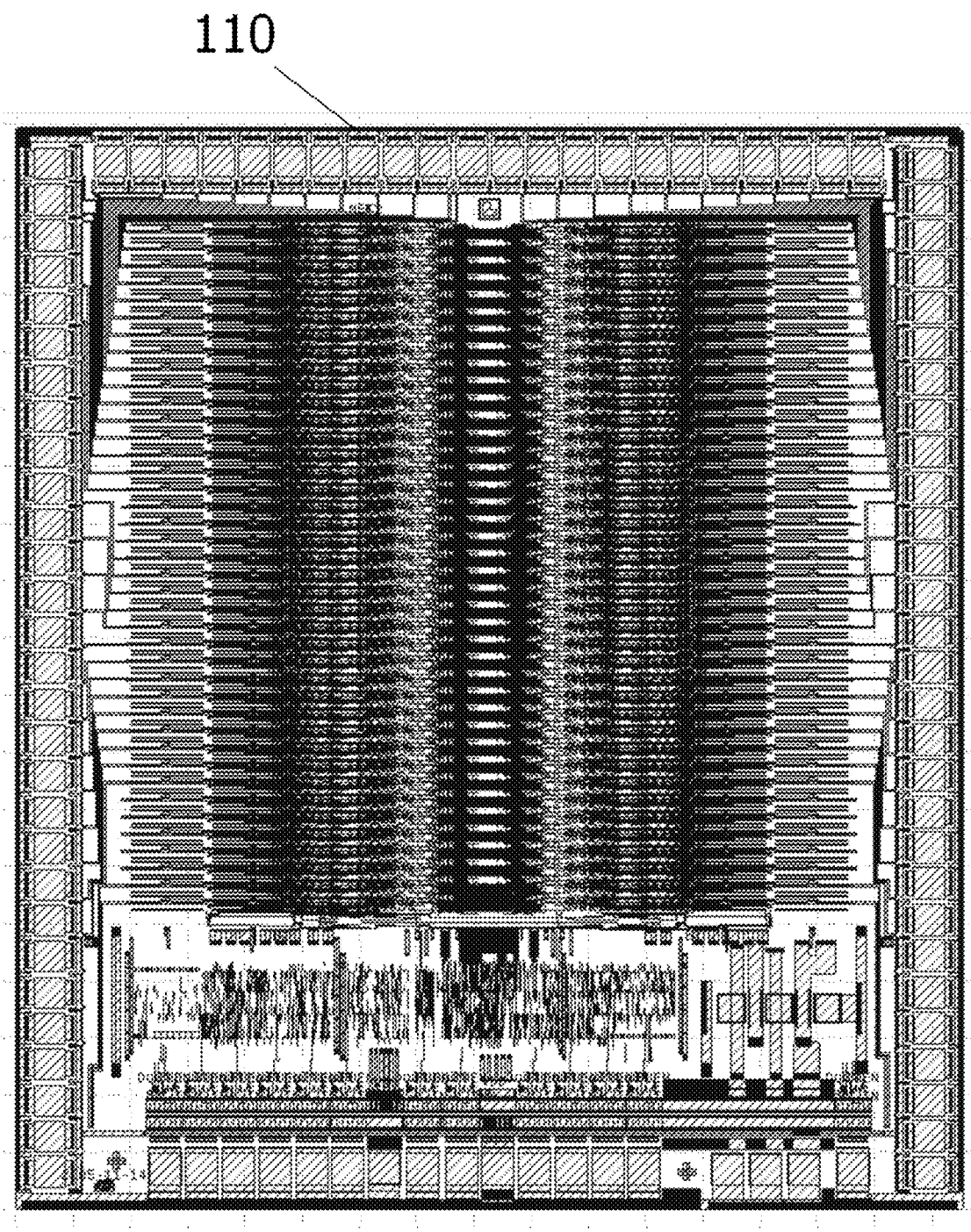
FIG. 3A is the retrieve design layout drawing chart for the smart system of the present invention.

Further, real practice way of each steps in flowchart 100 of the smart system is described in detail. First of all, retrieval of design layout pattern in step 110 is mainly processed based on the IC design layout pattern 1110 of a design house 30. Please refer to FIG. 3A. It is a chart about obtaining a design layout pattern in smart system of present invention. As shown in FIG. 3A, user (i.e. engineer in design house 30) retrieves design layout pattern 1110 in advance through the data processing center 31. The design layout pattern 1110 format can be GDS format, GDS-II format, or OASIS format.

Figure 3B:
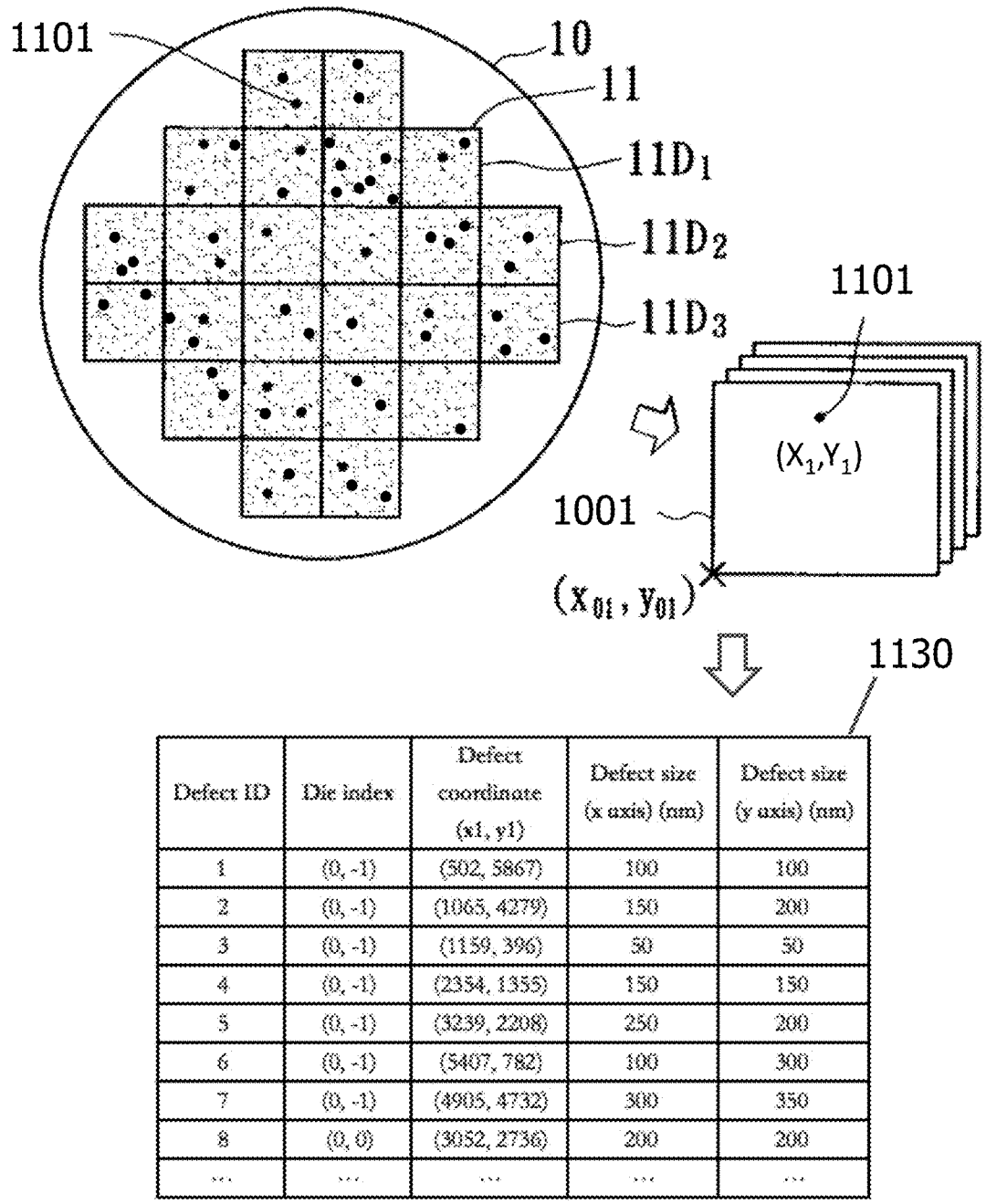
FIG. 3B is the retrieve defect data drawing chart for the smart system of the present invention.

Then, please see FIG. 3B. It is a chart about obtaining a defect data file in smart system of present invention. As described before, a design layout pattern file 1110 is already completed in design house 30 and delivered to fab 20. Through manufacturing process, fab 20 can produce and form full chip layout 11 pattern on wafer 10. In full chip layout 11, includes a plurality of dies. For example, 11D1, 11D2, 11D3. Then, fab 20 use defect inspection tool to do defect scan and inspection on wafer 10. So, obtain the plurality of defect images 1101 and defect text data over the full chip layout 11. Then, data processing center 21 extracts and calculates one or more defect images 1101 generated on which die of wafer 10 and the defect location on that die.

Furthermore, please see FIG. 3B. Data processing center 21 obtains every defect coordinate $(X_1, Y_1)$ of wafer 10, and obtains defect image 1101 in image file 1001, and the circuit pattern 1102 in the image file 1001. Please continue on FIG. 3B. Out of many dies in wafer 10, there are total 7 defect images 1101 detected in die 11. Data processing center 21 displays defect image coordinate $(X_1, Y_1)$ with reference to the first reference original coordinate $(X_{01}, Y_{01})$. For example, the first reference original coordinate $(X_{01}, Y_{01})$ is generated from the defect inspection tool's recipe. Normally, first reference original coordinate $(X_{01}, Y_{01})$ is selected at die 11 corner or a very easy recognized location as a reference marker. As to the marker, the present invention does not put a limitation on it. Finally, data processing center 21 obtains each defect text and image data file 1130. Then, use wafer 10 link to the defect text and image data file 1130. In defect text and image data file 1130, record each defect image's content, including die 11 die index number, defect image 1101 identification number, product name, defect inspection step, lot ID, defect inspection tool ID, defect coordinate $(X_1, Y_1)$, and rough defect image dimension (including the maximum size in X direction and Y direction), etc. Finally, defect text and image data file 1130 will be stored in memory unit 23.

Figure 3C:
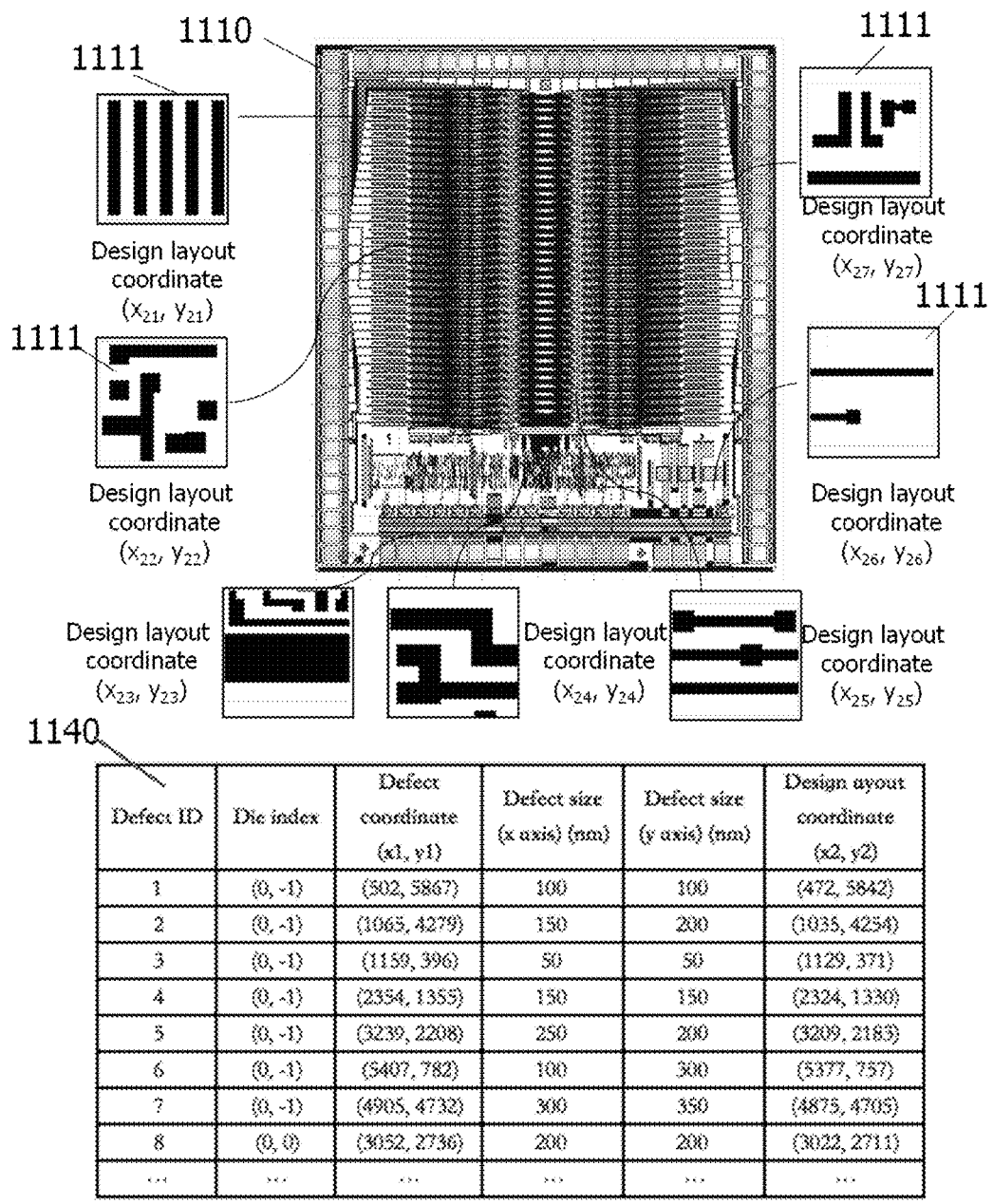
FIG. 3C is the defect to design layout coordinate conversion drawing chart for the smart system of the present invention.

Then, perform defect data coordinate conversion and coordinate deviation calibration in step 130. Please refer to FIG. 3C, it is a drawing chart in smart system of present invention about the coordinate conversion between design layout pattern and the defect data. As shown in FIG. 3C, data processing center 21 extracts every defect image 1101 and its coordinate $(X_1, Y_1)$ in die 11 from the defect text and image data file 1130. The data processing center 21 processes the defect to design layout pattern coordinate conversion. For example: Data processing center 21 handles the defect coordinate $(X_1, Y_1)$ in defect text and image data file 1130 through coordinate conversion process and maps to the coordinate $(X_2, Y_2)$ in defect layout pattern 1111 of a design layout pattern 1110. The defect coordinate $(X_1, Y_1)$ in defect text and image data file 1130 is converted to design layout coordinate $(X_2, Y_2)$ based on the design layout pattern 1110 reference marker coordinate. As shown in FIG. 3C, the 7 defect images 1101 of those defect ID 1~7 is converted to defect layout pattern 1111 with corresponding defect coordinate $(X_{21}, Y_{22})$ to $(X_{27}, Y_{27})$. As to the dimension size in defect layout pattern 1111, it is determined by the defect inspection tool's precision level or deviation range. For example: When use an optical defect inspection tool with a deviation range −0.5 μm~+0.5 μm to perform the defect scan and inspection, then the deviation range of the defect layout pattern 1111 is 1 μm×1 μm. In the defect layout pattern 1111, the conductor layout pattern dimension can be 50 nm and the spacing between two conductor layout patterns can be 30 nm.

Besides, the purpose to convert the defect coordinate $(X_1, Y_1)$ to design layout coordinate $(X_2, Y_2)$ in design layout pattern 1110 is to judge whether a defect image 1101 would cause a circuit layout pattern 1102 to be a short circuit defect or open circuit defect. However, defect coordinate $(X_1, Y_1)$ for defect image 1101 is measured from the defect inspection tool. The reference marker coordinate could be a die 11 and its first reference original point coordinate $(X_{01}, Y_{01})$ as a center point. Design layout pattern 1110 does have its own reference original point coordinate $(X_{02}, Y_{02})$. Since mask contains both the design layout reference original point coordinate $(X_{02}, Y_{02})$ and reference marker layout pattern coordinate, the relative position of design layout reference original point coordinate to the reference marker layout pattern coordinate is decided. When user select the reference marker layout pattern coordinate $(X_{01}, Y_{01})$ for the defect inspection tool, then relative position of design layout reference original point coordinate to the reference marker layout pattern coordinate $(X_1, Y_{01})$ is calculated into the defect coordinate conversion system. In addition, there is coordinate deviation due to optical diffraction effect when inspect wafer 10 in a defect inspection tool. In a drawn design layout pattern, it is a rectangular pattern for the reference marker layout pattern. However, this reference marker layout pattern becomes rounded pattern on wafer because the optical diffraction makes the original drawn rectangular marker pattern to be a curvature rounded pattern.

So, there is a deviation between the defect image 1101 coordinate $(X_1, Y_1)$ and the original drawn rectangular marker pattern. Obviously for the same reference marker layout pattern, the deviation exists between reference marker layout pattern $(X_{01}, Y_{01})$ in wafer 10 and design layout reference marker layout pattern. After defect coordinate conversion, this coordinate deviation is shown on the defect layout pattern coordinate. It will be corrected through the coordinate deviation calibration system.

Figure 4:
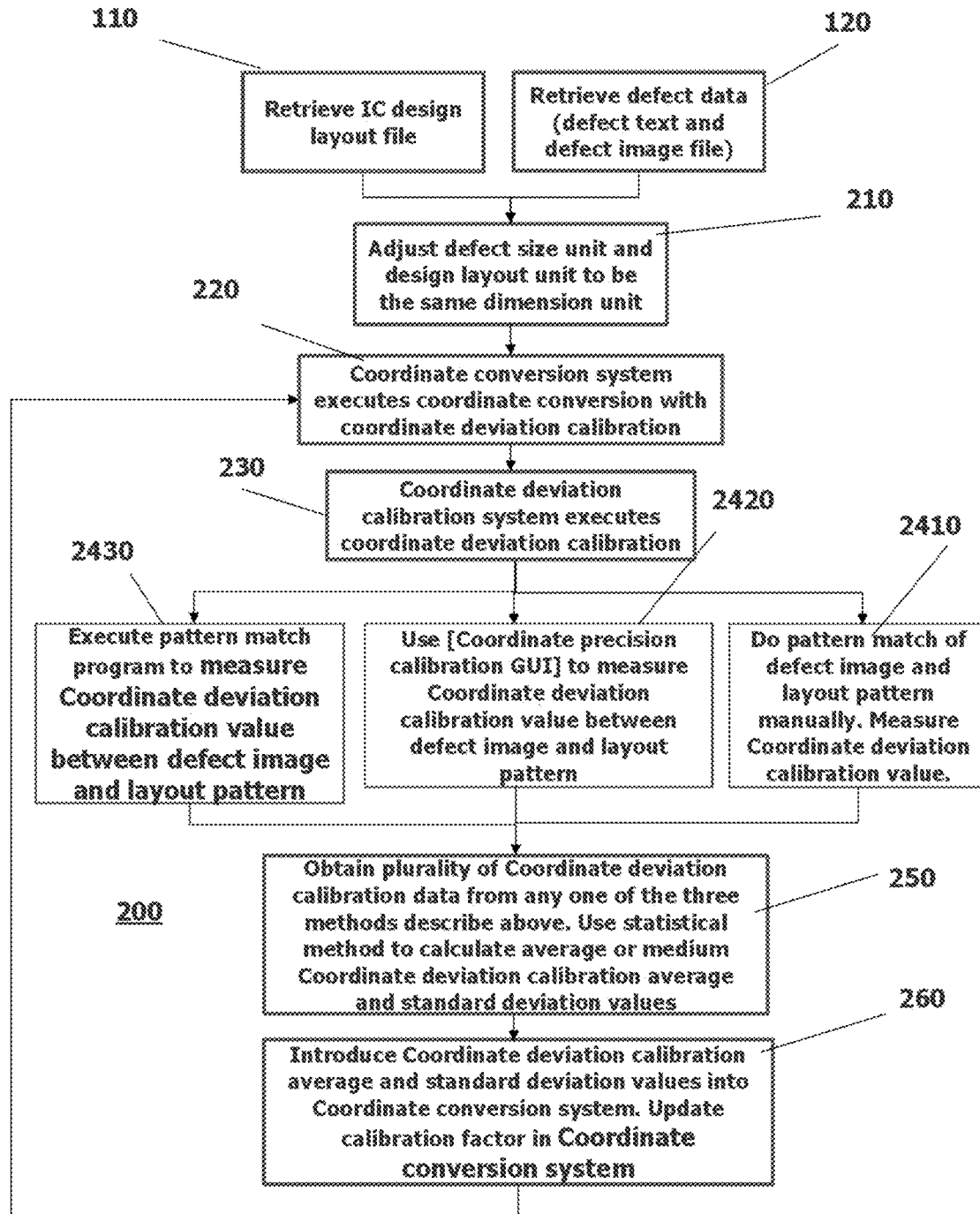
FIG. 4 is the defect to design layout coordinate conversion and coordinate deviation calibration flowchart for the smart system of the present invention.

Furthermore, the file format of defect image 1101 is different with the file format of design layout pattern 1110 in certain case. For example: When file format of defect image 1101 is JPEG, the unit is in pixel, micrometer or nanometer. When the file format of design layout pattern 1110 is in GDS, the unit is in micrometer (μm), or nanometer (nm). There might exist deviation between those different file format. So in a better practice example of the present invention, a precision calibration procedure is added and is shown in step 200. The actual calibration procedure of step 200 is shown in FIG. 4. FIG. 4 is the calibration process flowchart of the present invention for defect to design layout pattern coordinate conversion and deviation calibration. In the beginning, retrieve the design layout pattern file and defect data file as shown in FIG. 4 step 110 and step 120. Since the procedures are same as in FIG. 2. There is no need to repeat description here. Next, please see step 210. Step 210 is to adjust both units in defect image 1101 and design layout pattern 1110 to be the same unit. For example: User can choose a unit in pixel, μm, or nm, then adjust both units in defect image 1101 and design layout pattern 1110 to be the same unit. After that, step 220 can be finished. The defect image 1101 can be correctly transformed to design layout pattern 1110. In this way, the system can overcome the large defect to design layout coordinate conversion deviation problem that is induced from the difference between file format of defect image 1101 and file format of design layout pattern 1110.

Figure 5:
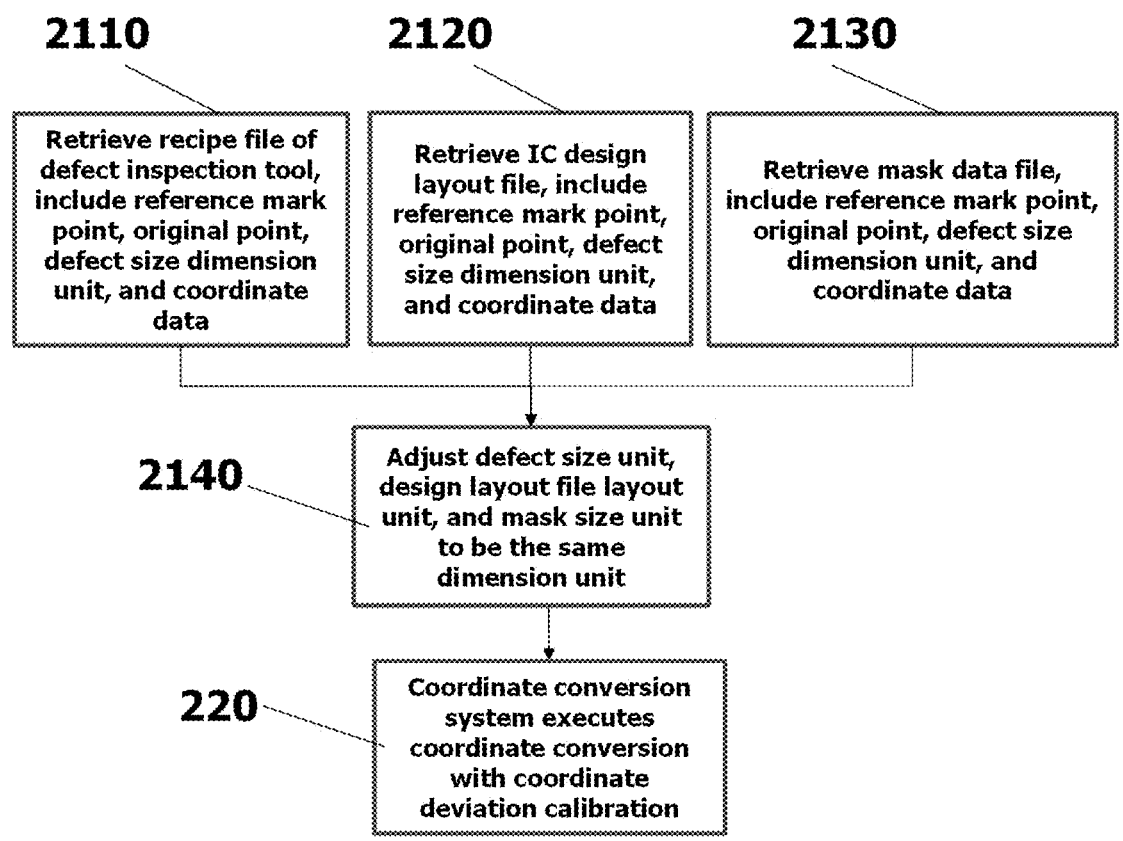
FIG. 5 is the defect to design layout coordinate conversion flowchart with defect size calibration for the smart system of the present invention.

In order to make the best precision for the defect image to design layout pattern coordinate conversion and deviation calibration, all the possible factors that might affect the coordinate conversion precision are included for calibration. More than that, the present invention provides a better practice example. Please refer to FIG. 5. It is a flowchart for defect size calibration and coordinate conversion. As shown in FIG. 5, the first step 2110 is to retrieve the parameters from defect inspection tool. For example: Data processing center 21 retrieves from memory unit 23, the alignment reference marker coordinate, dimension data, etc. of a defect inspection tool. Or step 2120 retrieving the parameters of a design layout pattern 1110. For example: Data processing center 21 retrieves from memory unit 23 the original coordinate, alignment reference coordinate, and dimension data, etc. of a design layout pattern 1110. Or step 2130 retrieving the parameters of a mask. For example: Data processing center 21 retrieves from memory unit 23 the original coordinate, alignment reference coordinate, center point coordinate, and dimension data, etc. of a mask. Then, adjust the dimension of defect image 1101, dimension of design layout pattern 1110, and proportional dimension as defined in mask data to be the same as shown in step 2140. Without step 2140, step 220 cannot be completed. User must choose one or multiple reference marker pattern to setup the alignment mark reference marker coordinate for the defect inspection tool. The marker pattern can be a L shape pattern, a cross pattern (+), or a rectangular pattern, etc. The marker pattern is a simple pattern that can be aligned easily. In general case, the marker pattern is placed in the scribe line that is close to the die corner. That means the marker pattern is not placed inside design layout. Only mask data includes all the marker pattern coordinate inside scribe line, design layout corner and original point coordinate, and mask center point coordinate. That is why all the distances between marker pattern/alignment marker and design layout pattern 1110 original point can be calculated based on the mask parameters data. The coordinate conversion system which converts the defect image coordinate to design layout pattern 1110 coordinate can be setup through the above marker pattern/alignment marker and design layout pattern 1110 original point coordinate relationship. So, a defect image 1101 of an image file 1001 coordinate $(X_1, Y_1)$ can be converted to design layout pattern 1110 coordinate $(X_2, Y_2)$ correctly. In the end, processing step 220 in this practice example will guarantee the coordinate deviation calibration, no matter in the coordinate conversion deviation calibration or real time pattern match between defect image 1101 of image file 1001 and design layout pattern 1110, with the coordinate deviation data as shown in step 230.

Figure 6A:
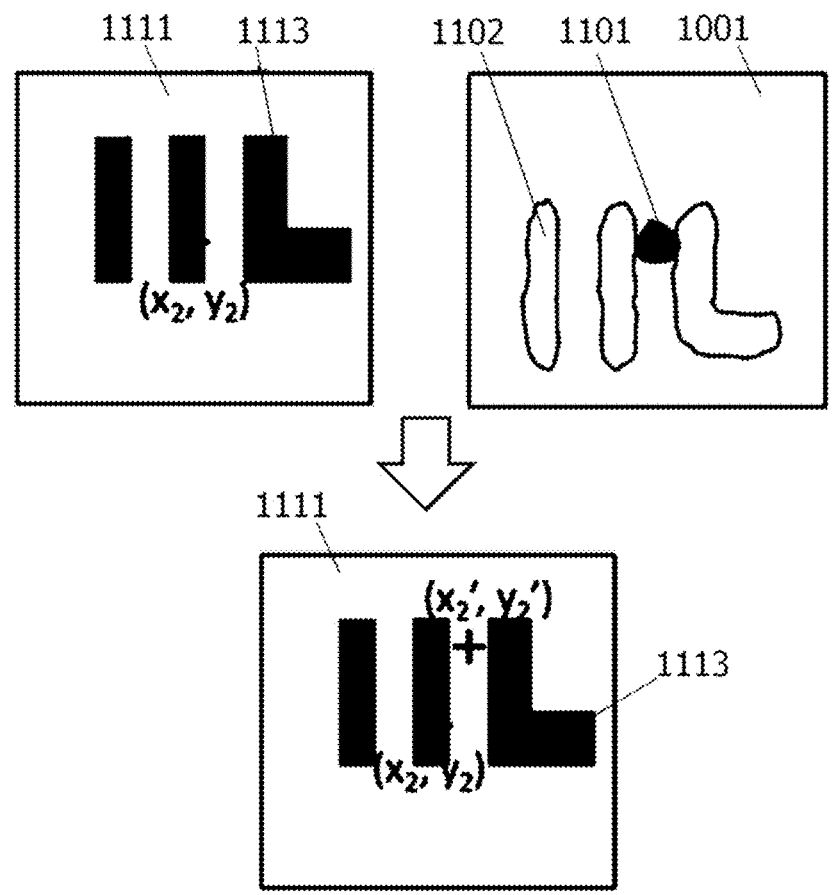
FIG. 6A to FIG. 6D are the multiple practice examples for coordinate deviation calibration drawing chart for the smart system of the present invention.

Please refer to FIG. 4. When step 220 already implements coordinate deviation calibration for all possible coordinate deviation factors, the defect image 1101 of image file 1001 is converted to a defect layout pattern 1111 coordinate $(X_2, Y_2)$ in design layout pattern 1110. Obviously, each defect layout pattern 1111 represents different layout pattern and different image pattern 1101. For example: Wafer 10 contains a thousand die 11D. There might be coordinate deviation in each defect layout pattern when the defect image 1101 defect coordinate $(X_1, Y_1)$ is converted to design layout pattern 1110 defect coordinate $(X_2, Y_2)$. So, the present invention further provides three methods to calibrate design layout pattern 1110 defect coordinate $(X_2, Y_2)$ deviation. First method. As shown in step 2410, data processing center 21 selects a defect image 1101 from memory unit 23. For example: Select a design layout pattern that includes the transistor device. Next, data processing center 21 retrieves a defect layout pattern 1111. Then, data processing center 21 retrieves defect image 1101 of image file 1001 that has the transistor device pattern. Display both the defect layout pattern 1111 and defect image 1101 of image file 1001 together on the computer monitor screen 51. In a practice example, the dimension unit is already adjusted to be the same in both displayed defect layout pattern 1111 and defect image 1101 of image file 1001. (For example: Both patterns are adjusted to dimension unit such as pixel unit, μm unit, or nm unit.) Then, user who execute the calibration manually processes the coordinate deviation distance from the defect layout pattern coordinate to actual defect layout pattern coordinate with mapped defect image on the monitor screen 51 for a certain defect image/defect layout pattern pairs and calculate the statistical coordinate deviation data. For example: On monitor screen 51, the coordinate deviation calibration sponsor aligns defect layout pattern 1111 and defect image 1101 of image file 1001 with a setting coordinate value manually as shown in FIG. 6A upper half. If the defect coordinate location $(X_2, Y_2)$ in the converted defect layout pattern 1111 is not in the same coordinate location with the new coordinate location $(X_2', Y_2')$ in the defect image 1101, then a coordinate deviation calibration must be performed to calibrate to new coordinate location $(X_2', Y_2')$. For example: Coordinate deviation calibration sponsor manually marks the defect image 1001 location to the corresponding location in defect layout pattern 1111 as a new coordinate location $(X_2', Y_2')$. Obviously, the location of defect image file 1001 is converted to defect layout pattern 1111 actual defect coordinate location with the coordinate deviation calibration value as $(X_2'-X_2, Y_2'-Y_2)$ as shown in lower half of FIG. 6A. Collect a certain amount of coordinate deviation calibration data. For example: Collect at least 51 coordinate deviation calibration data. As shown in step 250, data processing center 21 will process the data in a table and performs statistical analysis. Then, the system can generate an average coordinate precision value and coordinate precision standard deviation for X-axis and Y-axis as the coordinate calibration factor as shown in FIG. 6D. In a better practice example: If data processing center 21 with enough memory capacity and fast processing speed, then user can choose to do match for each defect layout pattern 1111 and each defect image 1101 of image file 1001. For example: Match 10000 defect images 1101 and get an even more accurate statistical data as the coordinate deviation calibration data or calibration factor data. The present invention does not put a limit on this. Finally, retrieve the accurate statistical data as the coordinate deviation calibration data or calibration factor data as shown in step 260. The average coordinate precision value and coordinate precision standard deviation can be introduced into the coordinate conversion system. For the defect image 1101 in the defect layout pattern 1111 through coordinate conversion, a coordinate deviation calibration is performed. The coordinate deviation value is $(X_2'-X_2, Y_2'-Y_2)$ or average coordinate precision value and coordinate precision standard deviation for X-axis and Y-axis after processing statistical analysis of coordinate deviation value $(X_2'-X_2, Y_2'-Y_2)$. Finally, the file 1150 after correcting the coordinate deviation is stored in the memory unit 23.

Besides, the present invention can select another calibration method to produce the accurate coordinate deviation calibration data. As shown in step 2420, data processing center 21 retrieves the first transistor device defect layout pattern 1111. Then, data processing center 21 retrieves defect image 1101 of image file 1001 that has the transistor device pattern. Display both the defect layout pattern 1111 and defect image 1101 of image file 1001 together on the computer monitor screen 51. In a practice example, the dimension unit is already adjusted to be the same in both displayed defect layout pattern 1111 and defect image 1101 of image file 1001. (For example: Both patterns are adjusted to dimension unit such as pixel unit, µm unit, or nm unit.) Then, coordinate deviation calibration sponsor processes calibration through a Graphical User Interface (GUI).

Figure 6B:
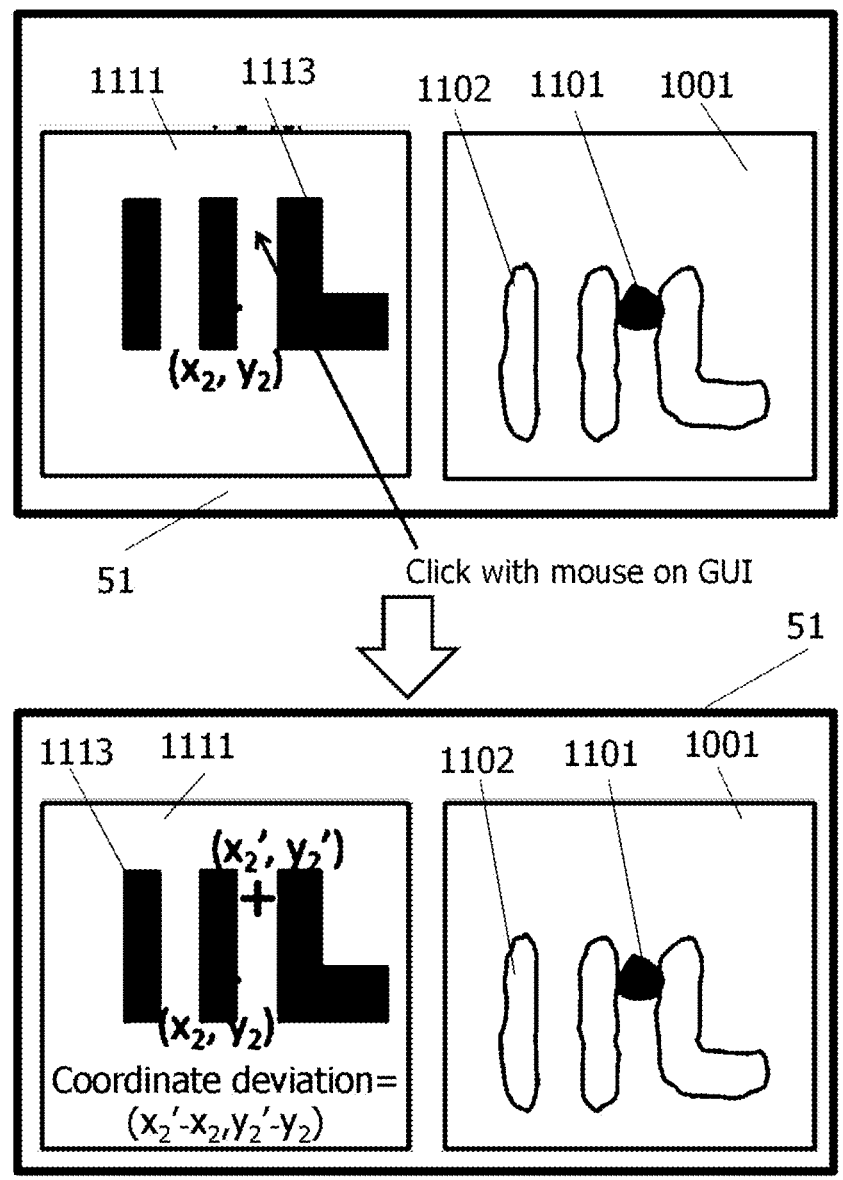

Coordinate deviation calibration sponsor moves computer mouse cursor on monitor screen 51 to new coordinate location $(X_2', Y_2')$ based on the defect image 1101 location relative to circuit layout pattern 1102 and the corresponding location in defect layout pattern 1111 with same circuit layout pattern as shown in upper half of FIG. 6B. For example: Coordinate deviation calibration sponsor manually moves cursor to defect image 1101 location mapped to the corresponding location in defect layout pattern 1111 and marks as a new coordinate location $(X_2', Y_2')$. Then, defect image 1101 defect coordinate $(X_1, Y_1)$ is converted to design layout pattern 1110 defect coordinate $(X_2, Y_2)$. If defect image 1101 in the defect layout pattern 1111 on converted defect coordinate location $(X_2, Y_2)$ is not in the same coordinate location with the new coordinate location $(X_2', Y_2')$ in the defect image 1101 and the defect layout pattern 1111, then coordinate deviation calibration value can be obtained through clicking mouse to the new coordinate location $(X_2', Y_2')$ in GUI. The coordinate deviation calibration data is $(X_2'-X_2, Y_2'-Y_2)$ as shown in lower half of FIG. 6B. After that, follow the procedures from step 250 to step 260 and performs a certain amount of coordinate deviation calibration as same as in FIG. 6A. The system can generate an average coordinate precision value and coordinate precision standard deviation for X-axis and Y-axis as the coordinate calibration factor. The average coordinate precision value and coordinate precision standard deviation can be introduced into the coordinate conversion system. It is same as described in above item.

In addition, the present invention can select another calibration method to create accurate coordinate deviation calibration data. As shown in step 2430, data processing center 21 retrieves the first transistor device defect layout pattern 1111. Then, data processing center 21 retrieves defect image 1101 of image file 1001 that has the transistor device pattern. Display both the defect layout pattern 1111 and defect image 1101 of image file 1001 together on the computer monitor screen 51. In a practice example, the dimension unit is already adjusted to be the same in both displayed defect layout pattern 1111 and defect image 1101 of image file 1001. (For example: Both patterns are adjusted to dimension unit such as pixel unit, µm unit, or nm unit.) Then, data processing center 21 performs auto pattern match between circuit layout pattern 1113 in defect layout pattern 1111 and circuit pattern 1102 in defect image 1101 of image file 1001 as shown in middle figure of FIG. 6C. Coordinate deviation calibration sponsor can mark new coordinate location $(X_2', Y_2')$ where location $(X_1, Y_1)$ of the defect image 1101 is mapped to the corresponding location in defect layout pattern 1111. Since defect coordinate $(X_1, Y_1)$ of defect image 1101 is converted to a defect coordinate $(X_2, Y_2)$ of design layout pattern 1101. If defect image 1101 in the defect layout pattern 1111 on converted defect coordinate location $(X_2, Y_2)$ is not in the same coordinate location with the new coordinate location $(X_2', Y_2')$ in the defect image 1101 and the defect layout pattern 1111, then coordinate deviation calibration value can be obtained through system coordinate deviation calibration. The coordinate deviation calibration data is $(X_2'-X_2, Y_2'-Y_2)$ as shown in FIG. 6C lower half.

After that, follow the procedures from step 250 to step 270 and performs a certain amount of coordinate deviation calibration as same as in FIG. 6A. The system can generate an average coordinate precision value and coordinate precision standard deviation for X-axis and Y-axis as the coordinate calibration factor. The average coordinate precision value and coordinate precision standard deviation can be introduced into the coordinate conversion system. It is same as described in above item.

Figure 6C:
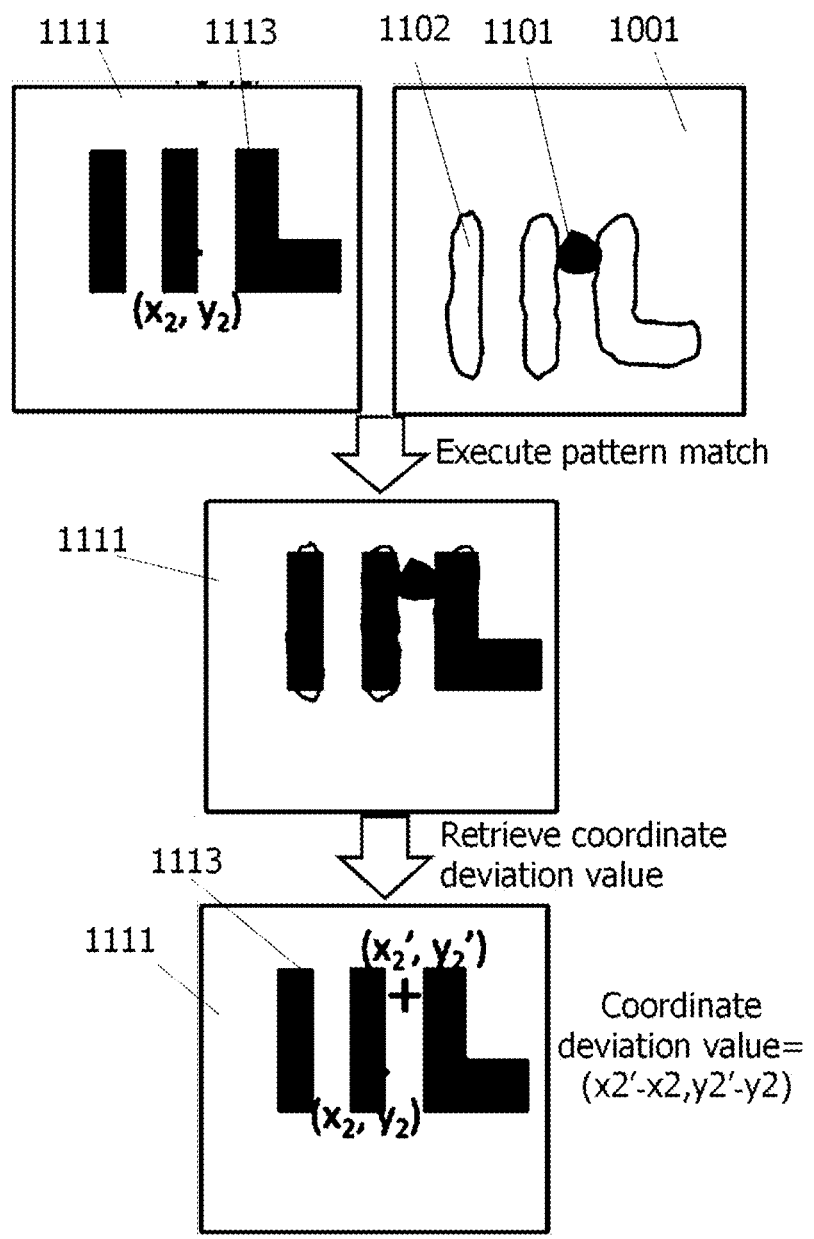
Figures 6D, 7A:
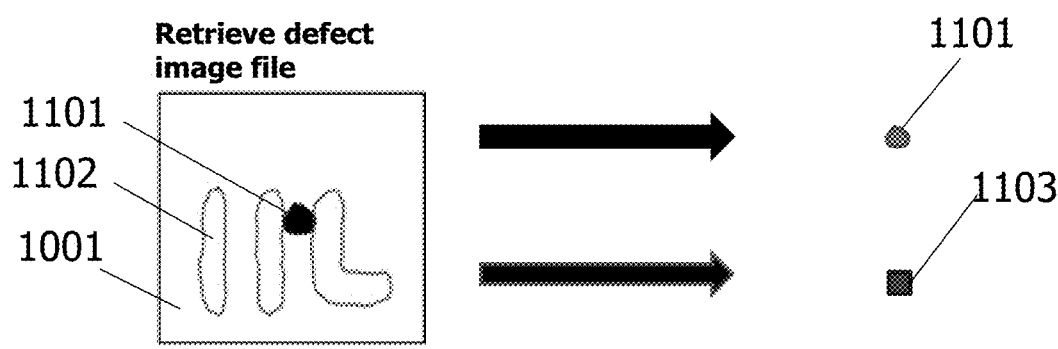
FIG. 7A to FIG. 7E are the multiple practice examples for clipping defect contour and overlapping to mapped design layout pattern drawing chart for the smart system of the present invention.

The method described in FIGS. 6A, 6B, and 6C explains that the present invention can offer multiple practice methods to provide accurate coordinate deviation calibration data. No matter which method is chosen, i.e. from any method in FIG. 6A, 6B, or 6C, the system can generate coordinate deviation calibration data or an accurate statistical data for coordinate deviation calibration or deviation calibration factor by processing step 250 to step 260.

After completion of step 200, the smart system of the present invention already obtains the defect image 1101 to design layout pattern 1110 coordinate conversion with coordinate deviation calibration. The coordinate deviation calibration data is $(X_2'-X_2, Y_2'-Y_2)$ or statistical analysis value of coordinate deviation calibration data (that is the above-mentioned coordinate calibration factor). For example: average coordinate precision value and coordinate precision standard deviation for X-axis and Y-axis. Next, defect image 1101 is created in design layout pattern 1110. It is used to judge whether this defect image 1101 is an open circuit failure killer defect or a short circuit failure killer defect. The defect image 1101 or its contour is image pattern. Design layout pattern 1110 is GDS or OASIS format. Since there is no defect image in design layout pattern 1110, it is impossible to execute short circuit failure or open circuit failure analysis with the defect image 1101. Since defect image 1101 contour pattern is a possible irregular shape pattern. The present invention provides a clip defect contour method for the defect image 1101 to obtain defect size dimension and area of defect image 1101. It is used to be the foundation to judge a short circuit failure killer defect or open circuit failure killer defect.

As shown in step 140 and FIG. 7A to FIG. 7D, it is the drawing chart of the present invention from clip defect contour of a defect image to overlap a design layout pattern on the defect coordinate location. First, data processing center 21 of the smart system retrieves a defect image 1101 contour dimension of an image file 1001 from the defect text and image data file 1130. The defect dimension data includes maximum dimension in X-axis and maximum dimension in Y-axis. Based on the clipped contour dimension of the defect image 1101, data processing center 21 creates a polygon defect image 1103 pattern which has the identical X-axis and Y-axis dimension of a defect contour. For example: If the maximum X-axis dimension is 0.1 μm and the maximum Y-axis dimension is 0.08 μm, then the polygon defect image 1103 pattern area is 0.008 μm² as shown in FIG. 7A lower arrow. Superpose or map the clipped contour pattern of defect image 1101 or polygon defect pattern 1103 to the defect layout pattern 1111 location ($X_2'$, $Y_2'$) under one of the coordinate calibrations, i.e. coordinate after coordinate deviation calibration, or coordinate deviation calibration value ($X_2'$-$X_2$, $Y_2'$-$Y_2$), or statistical value of coordinate deviation calibration data. The system can judge whether dimension of the clipped contour pattern of defect image 1101 or polygon defect pattern 1103 will create killer defect impact on the short circuit failure or open circuit failure. As shown on FIG. 7B right hand side defect layout pattern 1111, it is a kind of short circuit failure killer defect, i.e. two circuit layout patterns 1113 connected together by a defect image 1101. As shown on FIG. 7B left hand side defect layout pattern 1111, it is a kind of open circuit failure killer defect, i.e. one broken circuit layout pattern 1113 intercepted by a defect image 1101. Then, step 150 or step 160 can be used to judge whether there is open circuit failure killer defect or short circuit failure killer defect in defect image 1101 or defect layout pattern 1111.

Figure 7B:
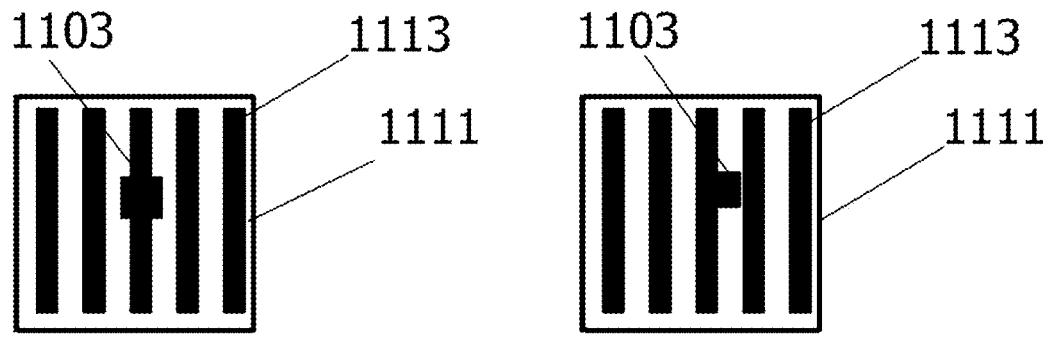
Figure 7C:
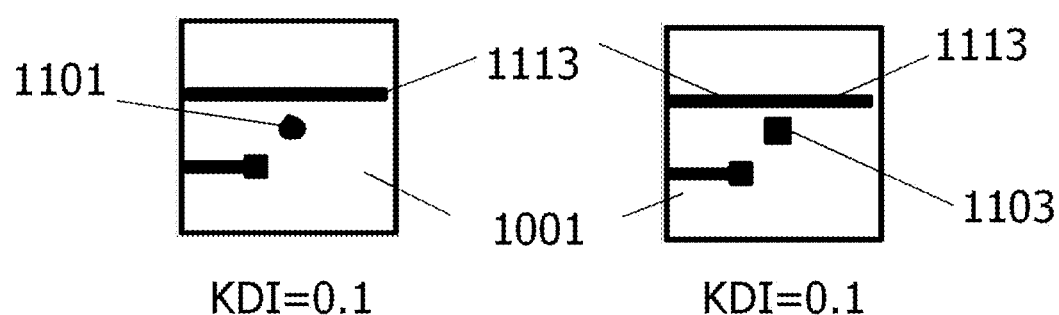

Next, perform Critical Area Analysis (CAA) method on step 150. When data processing center 21 already overlaps the clipped polygon defect image 1103 area onto the mapped coordinate of defect layout pattern 1111 of defect image 1101. Now, the system can utilize CAA method to analyze critical area for the clipped polygon defect image 1103 area and the mapped defect layout pattern 1111. Then, the system can judge short circuit failure or open circuit failure probability of a defect. This probability value for a defect is a Killer Defect Index (KDI), i.e. a CAA value. For example: The system overlaps every clipped polygon defect image 1103 onto the mapped defect layout pattern 1111. Then, system judges whether there is a short circuit failure or open circuit failure on the circuit layout pattern 1113. At same time, the system can judge the Killer Defect Index value from the analyzed critical area value based on the polygon defect image 1103 and circuit layout pattern 1113. Please see killer defect judgment in FIG. 7C (i.e. defect ID 6 in FIG. 3C). When dimension of the clipped defect image 1101 or the clipped polygon defect image 1103 is much below the dimension of circuit layout pattern 1113 width or spacing between two circuit layout pattern 1113, the defect will not cause either open circuit failure or short circuit failure. For example: Dimension of a polygon defect image 1103 is 0.008 μm. Dimension of a circuit layout pattern 1113 width is 0.1 μm. Dimension for the spacing between two circuit layout patterns 1113 is 0.1 μm. No matter it is a defect image 1101 or a clipped polygon defect image 1103, the defect will not cause either open circuit failure or short circuit failure. The judged critical area is 0. So, Killer Defect Index is 0, i.e. KDI=0. Dimension of a polygon defect image 1103 (For example: 0.11 μm) is equal or close to dimension of circuit layout pattern 1113 width (For example: 0.1 μm). It is possible to cause short circuit failure or open circuit failure. Since the probability that a defect image 1101 pattern or polygon defect image 1103 will fall on circuit layout pattern 1113 of the defect layout pattern 1111 is related to the circuit layout pattern 1113 area ratio of the defect layout pattern 1111. As shown in FIG. 7C, when the critical area of circuit layout occupies only 1/10 of the total coordinate deviation region area inside a defect layout pattern 1111, then the judged killer defect area is 0.1. So, Killer Defect Index is 0.1, i.e. KDI=0.1. That is to say. The short circuit failure or open circuit failure probability of the circuit layout pattern 1113 in defect layout pattern 1111 (shown in FIG. 7C) caused by a polygon defect image 1103 is 0.1.

Figure 7D:
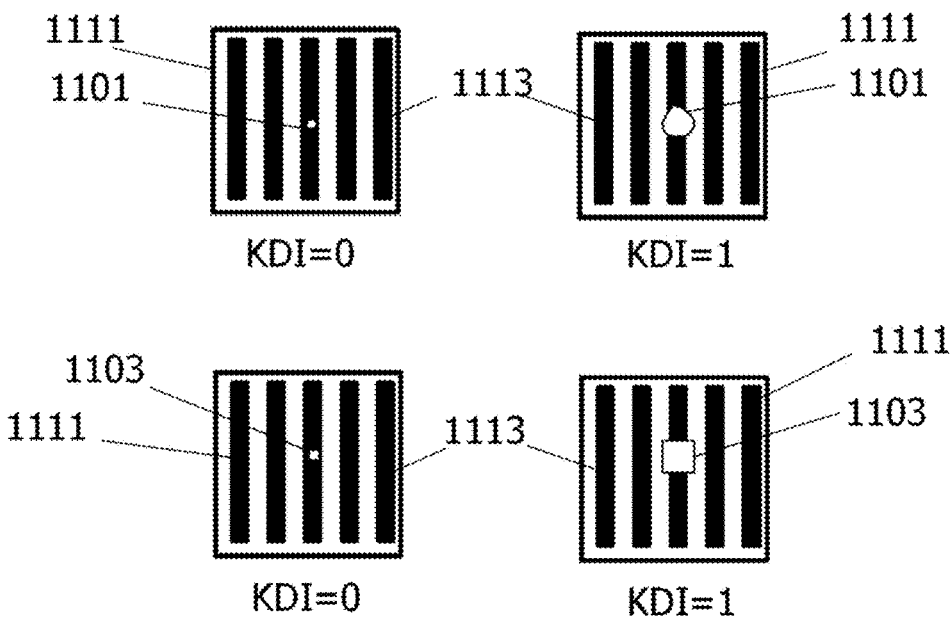
Figure 7E:
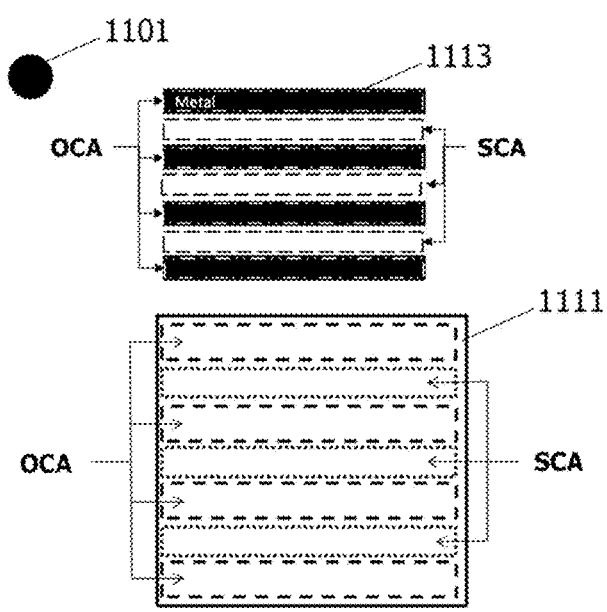

FIG. 7D is used to describe the implementation of how to analyze and judge Killer Defect Index. As shown in FIG. 7D, Critical Area Analysis method used in the present invention is often used in design for manufacturing to simulate wafer yield. It analyzes the critical area of an IC design layout with artificial defect data. The artificial defect data is generated with Monte-Carlo method or similar method with random defect generation. It is not a real defect data output from a defect inspection data. Those randomly generated defect data are spread randomly over different coordinate location in a full chip design layout. The purpose is to simulate the artificial defect that will cause possible yield loss and get the possible wafer yield with this kind of defect distribution assumption. CAA in design for manufacturing wafer yield simulation is not a real wafer defect analysis. CAA used in the present invention is to analyze defect data from defect inspection tool. The clipped defect image 1101 and its defect size dimension, area is converted to the corresponding coordinate in the defect layout pattern 1111. Then, calculate the critical area based on the defect image 1101, defect size dimension, area, and the defect layout pattern 1111 information within a coordinate deviation region area. (As described before, defect can be in any coordinate location inside this coordinate deviation region area because the deviation from the defect inspection tool's stage movement motor precision error. The Killer defect Index (KDI) is equal to the critical area from CAA analysis divided by the total coordinate deviation region area. This KDI value represents the probability of open circuit failure or short circuit failure for a defect and the defect's mapped defect layout pattern. As shown in left side pattern of FIG. 7D, defect image 1101 or clipped polygon defect image 1103 does not cause open circuit failure or short circuit failure. This defect is not a killer defect. The critical area is judged as 0. KDI is used for defect sample selection. When KDI is equal to 0 or very close to 0, that represents the open circuit failure or short circuit failure probability of this defect is very low. As a result, this defect is not selected in defect sample selection. As shown in right side pattern of FIG. 7D, the dimension of a defect image 1101 or a polygon defect image 1103 (For example: 0.11 μm) is equal or close to dimension of circuit layout pattern 1113 width (For example:

0.1 µm). It is possible to cause short circuit failure or open circuit failure. The analyzed open circuit failure critical area is named as Open Critical Area (OCA). The analyzed short circuit failure critical area is named as Short Critical Area (SCA). It is shown as the area defined by dashed line in FIG. 7E. Because Open Critical Area and Short Critical Area will cause either systematic defect or random defect failure. So, Open Critical Area and Short Critical Area must be added together (not counting overlapped region twice). Then, this (OCA+SCA) is divided by total coordinate deviation region area. (As described, the coordinate deviation after defect scan and inspection is −0.5 µm~+0.5 µm for an optical defect inspection tool. Total coordinate deviation region area is 1 µm×1 µm for the defect layout pattern 1111) For example: The conductor width in a defect layout pattern 1111 is 50 nm. The spacing between two different conductors is 30 nm. Dimension of a defect image 1101 pattern is 60 nm. Obviously, this 60 nm dimension of defect image 1101 is a killer defect no matter what coordinate location it is inside the defect layout pattern 1111. When Open Critical Area (OCA) is equal to 0.7 µm$^2$ and Short Critical Area (SCA) is equal to 0.3 µm$^2$. Assume there is no overlap of OCA and SCA. The defect sample selection indicator KDI is equal to 1 from calculation as described as 0.7 µm$^2$+0.3 µm$^2$/1 µm×1 µm=1. When defect sample selection indication KDI is equal to 1 or very close to 1, it represents the open circuit failure or short circuit failure probability of the defect is very high. This defect is selected as high failure probability. In the end, the defect sample probability of the plurality of polygon defect images 1103 will be recorded into memory unit 23.

Besides, the present invention can also choose step 160 to judge whether a defect will cause open circuit failure or short circuit failure probability or not. Clip a defect image 1101 of image file 1001 (this image file 1001 is same as described at prior section. Include defect image 1101 contour and its coordinate location relative to surrounding circuit pattern) directly. Then, overlap this clipped defect image 1101 onto the mapped defect layout pattern 1111 (as shown in middle of FIG. 6C). After that, the system can judge whether this defect image 1101 is an open circuit failure killer defect or a short circuit failure killer defect. For example: Data processing center 21 clips directly an original defect image 1101 contour of image file 1001 and overlaps this defect image contour to the mapped (relative to defect image 1101) defect layout pattern 1111. Now, either data processing center or engineer can perform pattern match based on the original defect image 1101 contour and defect layout pattern. Judge whether this original defect image contour is an open circuit failure type failure defect or short circuit failure type failure defect. If the result is either an open circuit failure or short circuit failure, then it is judged as a killer defect. The Killer Defect Index is 1. If the result is neither an open circuit failure nor short circuit failure, then it is judged as a non-killer defect. The Killer Defect Index is 0. Last step, record Killer Defect Index (KDI) results of those defect image 1101 into memory unit 23. Since this practice example is to clip directly an original defect image 1101 contour of image file 1001 and overlap this defect image contour to the mapped (relative to defect image 1101) defect layout pattern 1111. Obviously, the system can judge open circuit failure result, short circuit failure result, and decide KDI value of defect image 1101 directly. A better practice example in process step 160 is shown as follows. First, process step in FIG. 4 or FIG. 5. That means obtaining correct defect coordinate of original defect image 1101 contour and converting accurately to the mapped defect layout pattern 1111 coordinate (relative to defect image 1101 coordinate) are very critical. Besides, another better practice example in process step 160 is shown as follows. Defect image 1101 of image file 1101 is an image file generated from the Scanning Electron Microscope (SEM) defect scan result. Because the high precision level from SEM defect scan, the coordinate in the original defect image 1101 of a SEM image file is the actual defect location. So, KDI value of the defect image 1101 can be known directly. That is why the KDI value is either 1 or 0 under this practice example. The purpose to overlap this original defect image 1101 contour to the mapped defect layout pattern 1111 (relative to defect image 1101) is to know exactly what defect layout pattern 1111 coordinate location the defect image 1101 falls on. So, design house can modify design layout based on the defect layout pattern that would create failure killer defect.

Based on above description: When doing killer defect index (KDI) analysis or Critical Area Analysis (CAA) of defect image 1101, smart system of the present invention can choose original defect image 1101 contour of image file 1001 and overlap this defect contour to the mapped defect layout pattern 1111 of defect image 1101. It is shown in step 150. About this, it is not limited by the present invention.

According to description before, fab team processes defect scan and inspection of wafer 10 to get defect image 1101. In order to achieve high speed scanning purpose, fab normally selects microscope tool, E-beam inspection tool, optical inspection tool, defect scan tool, or camera etc. to obtain defect inspection data (For example: defect size, width, coordinate, or contour, etc.) of the wafer. When using the optical inspection tool to scan wafer and create defect image 1101, there is unclear defect image due to insufficient resolution ability from the optical inspection tool. That is because the defect scan resolution is related to the optical inspection tool's lens and wavelength. If the pattern to be scanned on wafer 10 becomes smaller enough, then the resolution of the optical inspection tool cannot inspect and compare the pattern of the wafer 10 clearly. A vague defect image 1101 is generated under insufficient resolution issue. For example, when defect image 1101 is a defocus image, the rough edge of the defect image 1101 is hard to be correctly judged in the clip of defect image 1101 contour. That will make the defect image 1101 from defect scan to be larger than its actual defect image. This incorrect dimension of defect image 1101 will generate incorrect killer defect and non-killer defect classification due to this misjudgment. Besides, every optical inspection tool has its own resolution limit. If the resolution is insufficient in the defect inspection of smaller geometry pattern, that means the minimum dimension unit used in defect scan and defect judgment of an optical inspection tool is larger than minimum geometry dimension of the layout pattern. Under such circumstance, defect image 1101 pattern is a defocus image. This will result in killer defect misjudgment. For example: The minimum resolution unit is 50 nm in an optical inspection tool. An actual X-axis defect size dimension and Y-axis defect size dimension are 35 nm. So, the minimum dimension to be judged by this optical inspection tool is 50 nm. The original inspection defect report in defect text and image data file 1130 is recorded in the multiplication of minimum dimension unit for the scanned and detected defect image 1101 dimension and area. This defect image 1101 size dimension and area are much larger the actual defect image 1101 dimension and area using a 1 or 2 nm resolution level SEM tool to obtain clear defect image 1101. Obviously, the incorrectness of original defect size will impact Killer Defect Index analysis result. The non-killer defect or negligible risk killer defect will be judged as a high-risk killer defect incorrectly. For example: The actual defect image 1101 size and area is not a short circuit failure or open circuit failure defect. Due to minimum dimension unit of insufficient resolution and the defocus defect image result, the area of plurality defect image 1101 in the defect report file results in too many high-risk killer defects. That will lower the chance of selecting real open circuit failure defect sample or short circuit failure defect sample. This will result in slower yield improvement time and increase cost. Very clearly, this defect size of the defect image 1101 comes from the original defect inspection report file that is generated from the defect inspection tool with insufficient minimum dimension resolution problem. So, the incorrect defect size must be calibrated to approach real defect size dimension. Then the system can make correct defect classification judgment. So, the success rate of selecting open circuit failure defect or short circuit failure defect can be raised.

Figure 8A:
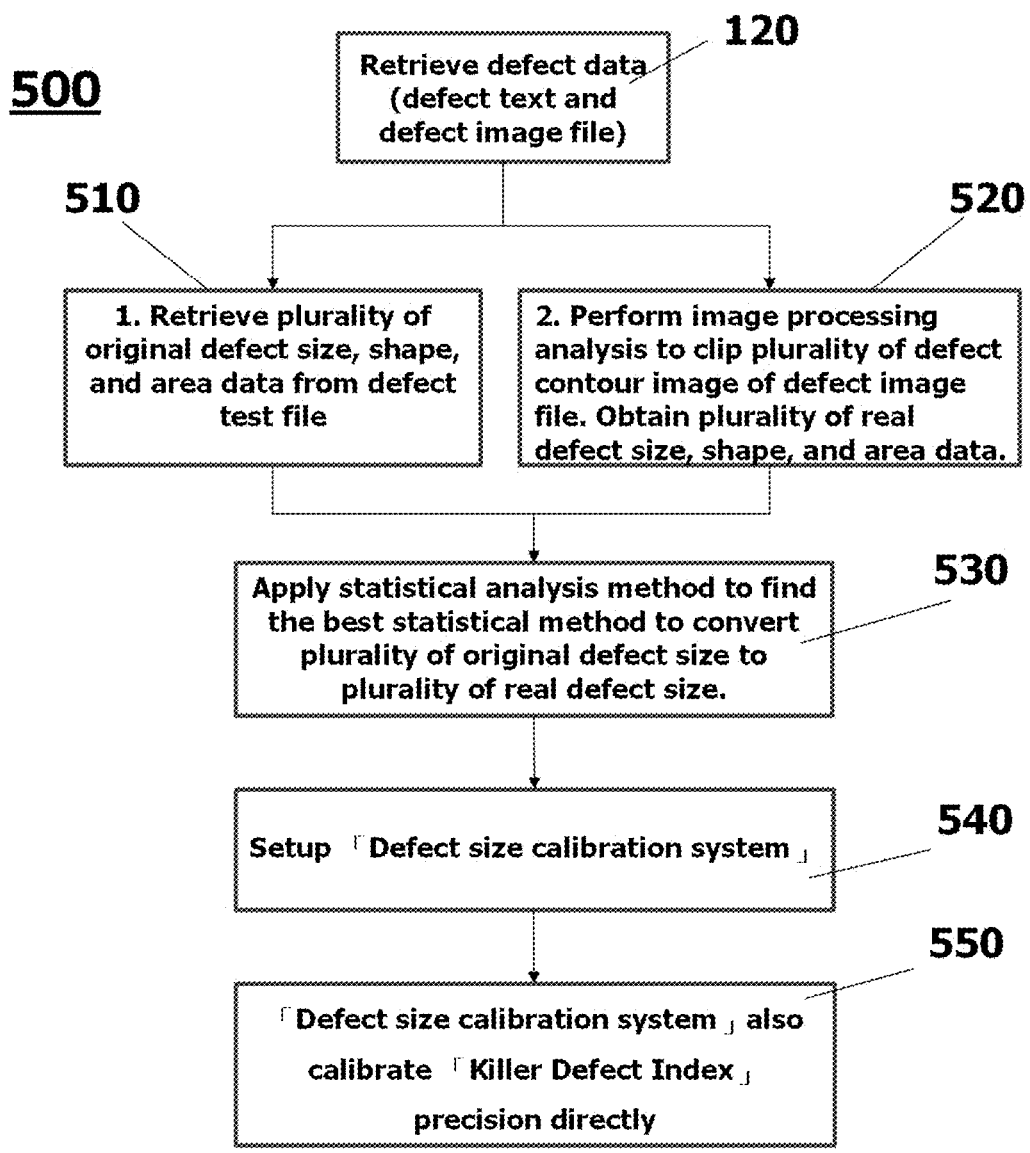
FIG. 8A and FIG. 8B are the setup defect size, defect area calibration system flowchart for the smart system of the present invention.
Figures 8B, 8C:
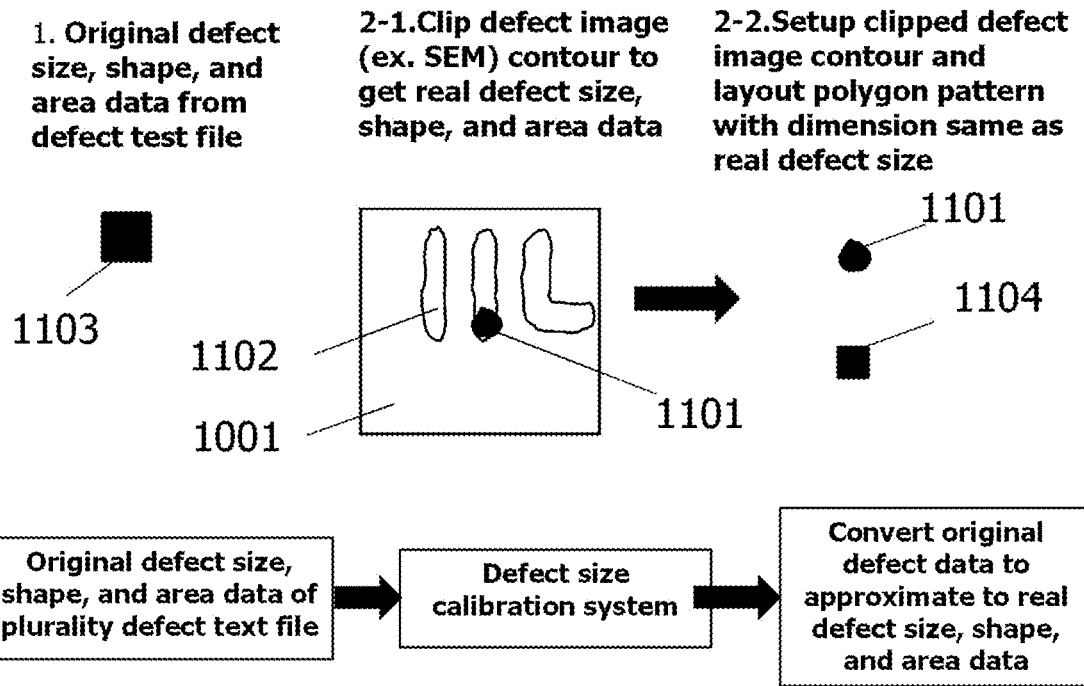
FIG. 8C is the conversion table from the original defect size to final defect size through high resolution defect image calibration for the smart system of the present invention.

In order to solve the resolution problem suffered from the wafer 10 defect inspection result of optical inspection tool, the present invention provides a defect size calibration method to calibrate defect size and area of defect image 1101. It is shown in FIG. 8A step 500. FIG. 8A is the step defect size and area calibration system process flowchart of the present invention. Precise defect size calibration is the only way to Critical Area Analysis (CAA) and Killer Defect Index (KDI) precision calibration. Left side in FIG. 8B is data processing center 21 retrieves original defect size, area of defect inspection report from the defect text and image data file 1130. Then, data processing center 21 clips defect contour of higher resolution defect image file from the defect text and image data file 1130. In the better practice example, higher resolution defect image file means the defect size and area from SEM image file. After that, use the higher resolution defect size and area result from SEM image file to calibrate the original defect contour size and convert to polygon defect pattern. In FIG. 8C, the table shows that the original defect size on the left side is converted to approximate to actual defect contour size through the higher resolution defect image file calibration. Detail description is explained as below.

As shown in FIG. 8A, it is a Critical Area Analysis and Killer Defect Index Calibration flowchart 500 of the present invention. It begins with data processing center 21 to retrieve defect text and image data file 1130. First, it is shown in step 120. Data processing center 21 retrieves original defect data (including text file and defect image file) from defect text and image data file 1130. Next, it is shown in step 510. Data processing center 21 retrieves original defect size in X-axis and Y-axis, and defect area of polygon defect image 1103 from defect text and image data file 1130. When the resolution of an optical inspection tool is not good enough for the defect scan, it will generate incorrect and larger defect size than real defect size. For example: Resolution of an optical inspection tool is 50 nm. The minimum dimension from defect inspection report is 50 nm. Even though the original defect size is less than 50 nm, the defect report from an optical inspection tool is in multiple times of 50 nm to display. So, there is a deviation between the minimum dimension detected in an optical inspection tool and the minimum dimension detected in a better resolution SEM tool (For example: SEM resolution is 2 nm). For example: It is shown in FIG. 8C. The original defect size for 3rd defect image 1101 is 50 nm in X-axis and 50 nm in Y-axis. The original defect size for 4th defect image 1101 is 150 nm in X-axis and 150 nm in Y-axis. The Killer Defect Index for 3rd defect image 1101 is 0.4. The Killer Defect Index for 4th defect image 1101 is 1. Then, it is shown in step 520. Data processing center 21 selects high resolution defect image 1101 from memory unit 23. Data processing center 21 clips defect image contour defect size and defect contour area of defect image 1101. For example: Use the SEM defect image with 3 nm resolution. The system can analyze that the SEM defect size for 3rd defect image 1101 is 35 nm in X-axis and 35 nm in Y-axis. The system can analyze that the SEM defect size for 4th defect image 1101 is 100 nm in X-axis and 120 nm in Y-axis. After defect size calibration for this practice example, more accurate KDI value can be obtained with precision calibration. For example: It is shown in FIG. 8C. The real Killer Defect Index after defect size calibration for 3rd defect image 1101 is 0.1. The real Killer Defect Index after defect size calibration for 4th defect image 1101 is 0.55. Next, it is shown in step 530. Apply statistical method to find the calibration factor between plurality original defect size, defect area data group, and plurality high resolution defect image contour size, defect contour area data group. Find the best calibration factor from the best statistical method. It is shown in step 540. Setup a defect size calibration system and metrology uncertainty analysis with statistical method. Convert the original defect size data, which is generated from an in-line defect inspection of an optical inspection tool, to approximate real defect size data. As to the real defect size conversion procedure, it will be described in next section in detail. Besides, one important thing is why not use better resolution SEM tool to do defect scan and inspection directly. Instead, process defect inspection in a more complex calibration procedure. That is because the defect inspection is scanned after finishing wafer 10 process step. Although SEM tool resolution is good enough, SEM tool operation is much more complex. SEM tool defect inspection throughput can only handle 1% of current original defect data volume. In order to speed up process time, it is impossible to use SEM to scan all the wafers. Fab team has to use optical inspection tool. Without doing defect size calibration, it will result in incorrect Killer Defect Index judgment for optical inspection tool. This will not just impact defect classification, but also impact wafer yield improvement. Increase fab cost. It is shown in step 550. Processing defect size calibration is same as raising Killer Defect Index precision level from Critical Area Analysis and judging killer defect classification precisely. In this practice example, selecting number of better resolution SEM images to do statistical analysis is not limited by the present invention. Furthermore, fab team can choose SEM tool or other advanced defect inspection tool to do defect scan and inspection in advanced technology fab process if SEM tool defect scan speed is improved fast enough or other advanced defect inspection tool can provide fast defect inspection. Under such circumstance, the accurate KDI value of a defect can be decided as described in step 160. Even though process shrink continues to small geometry to be equal or smaller than SEM resolution, the above defect size calibration system and method is still applied to any new defect inspection tool and camera tool. For example: Design layout pattern minimum geometry dimension is 1, 2 nm, or lower than 1 nm. Then, layout pattern minimum geometry dimension is equal to or smaller than SEM resolution. It is not limited by the present invention.

Please refer to FIG. 8C. Incorrect original defect size data is generated from fab in-line defect inspection tool. The defect size calibration process flow is to execute defect size calibration and metrology uncertainty analysis through this defect size calibration system and convert original defect size data to approximate actual defect size data. The setup of the defect size calibration system is shown in FIG. 8A and FIG. 8B. It is shown in step 540. For every defect image 1101, data processing center 21 collects the original defect size before defect size calibration and real defect size after defect size calibration and performs statistical analysis to build up a statistical model. The defect size X-axis and Y-axis data for defect image 1101 will be corrected based on this statistical model. For example: Use the defect image 1101 with KDI value 1 to do defect size calibration. The statistical model for the defect size calibration is built up. A defect size calibration factor is defined to be equal to 0.85. For example: In FIG. 8C, the original defect size for 4th defect image 1101 is 150 nm in X-axis and 150 nm in Y-axis. Then, do defect size calibration in step 540. Need to multiply defect size calibration factor 0.85 with original defect size in defect image 1101 or polygon defect image 1103. Then, defect size after defect size calibration will be 130 nm in X-axis and 130 nm in Y-axis for defect image 1104 or polygon defect image 1105 after calibration. Or use the defect image 1101 with KDT value 0.5 to do defect size calibration. The statistical model for the defect size calibration is built up. A defect size calibration factor is defined to be equal to 0.9. The defect size conversion process is same as described above. It is not repeated again. Then, it is shown as in step 550. Data processing center 21 extracts the calibration factor from defect size calibration statistical model, executes defect size calibration automatically for every defect image 1101, and overlaps onto the mapped design layout pattern 1110 relative to defect image 1101 coordinate. Finally, data processing center 21 or engineer can get more accurate Killer Defect Index for every defect image 1101 with new calibration.

After the calibration procedure 8A, 8B, and 8C, user can get more precise real defect size data. Since the killer defect index is proportional to the defect size. Incorrect defect size would cause defect count of higher killer defect index higher than it should be. That makes the selection of short failure defect or open failure defect even harder. Eventually, that increase time to improve wafer yield and cost. In FIG. 8C, the table 1160 shows the defect size data before and after defect size calibration. Obviously, the best result will be the calibration with SEM defect inspection data. Next will be to calibrate with a defect size calibration factor. When the calibration sample count is higher in determining the defect size calibration factor, the statistical defect size calibration factor will be closer to the SEM defect inspection data.

Figure 11:
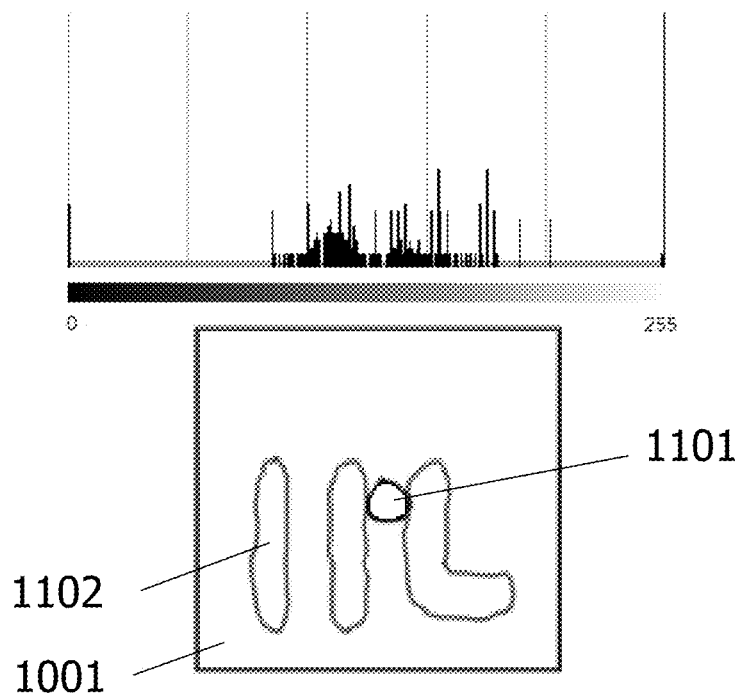
FIG. 11A to FIG. 11G are the defect pattern library for the smart system of the present invention.
Figure 11:
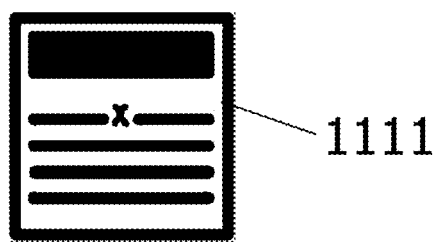
Figure 11:
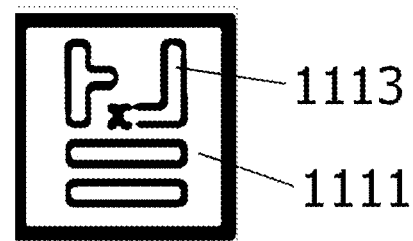
Figure 11:
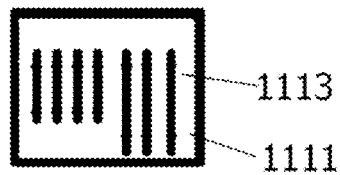
Figure 11:
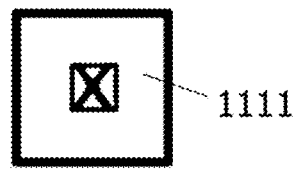
Figure 11:
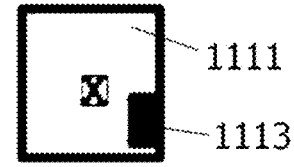
Figure 11:
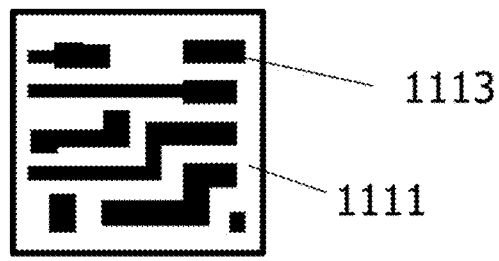

Please see FIG. 2. After processing defect open circuit failure or short circuit failure type analysis in step 150 and step 160 and calibration in step 500, the present invention can further perform defect classification for defect image 1101. As shown in step 170, the defect can be classified as Non-killer defect or Killer defect based on the defect calibration result in previous step. For example: The result by implementing step 150 is to classify defect based on KDI value, defect signal parameters, and whether a defect matches defect pattern in defect pattern library database and high frequent failure defect library. Defect signal parameters is the intensity or brightness value of every pixel data in two-dimensional vector analysis obtained from image processing analysis of the defect image 1101 of image file 1001. It is shown in FIG. 11A. The horizontal axis is the intensity. The vertical axis is in pixel count unit. Also, contrast value is the relative intensity ratio between defect pattern and its surrounding background pattern using image processing analysis method. Polarity value is to imply a relative position between the defect pattern and background pattern by checking the defect pattern and its light shadow change using image processing analysis method. In step 160, it is to overlap defect contour with two different polygon patterns or one polygon pattern and check whether this defect contour is classified as a non-killer defect, or open circuit failure type killer defect, or short circuit failure type killer defect. Detail execution procedure will be described in later section.

In addition, process step 180 in FIG. 2 to setup defect pattern library and frequent failure defect library. The defect pattern library source is described below. One defect pattern is layout pattern with design rule check error. For example: Spacing distance rule is 30 nm. Actual drawing layout pattern is 28 nm. This will narrow process window and result in lower wafer yield. So, it will be selected into defect pattern library as shown in FIG. 11B. Another defect pattern source is from the Design for Manufacturing (DFM) simulation analysis of a design layout 1110. If there is layout pattern showing high risk pattern from the DFM simulation analysis. Since it could narrow process window as well, it is possible to cause lower wafer yield. Further defect inspection of this layout pattern on wafer process window check is needed to verify if there is open circuit failure defect or short circuit failure defect based on the layout pattern locations on wafer. That is why it is selected into defect pattern library as shown in FIG. 11C X marker. The way to setup frequent failure defect library is to combine plurality of actual defect image 1101 data from optical inspection tool and perform pattern match method to obtain pattern group with identical or similar pattern as shown in FIG. 11D. When the circuit layout pattern is dense in a design layout, it belongs to a frequent failure defect pattern. Further defect inspection of this layout pattern on wafer process window check is needed to verify if there is open circuit failure defect or short circuit failure defect based on the frequent failure defect layout pattern locations on wafer. That is why it is selected into frequent failure defect library. User can collect systematic defect layout pattern 1111, open circuit failure type or short circuit failure type defect layout pattern found in failure analysis, layout pattern with DRC error, and Design for Manufacturing check as weak pattern together and setup into defect pattern library. User can also reference frequent failure defect library patent method cited in U.S. Pat. No. 8,607,169B2 of the same inventor and setup frequent failure defect library. In step 170, the system will execute pattern match (pattern match patent method reference is cited in ROC Taiwan patent no. 15346462 of the same inventor) between the defect layout pattern from defect inspection data of a defect inspection tool and those defect layout pattern in defect pattern library and frequent failure defect library. It is to find if there is identical or similar defect layout pattern for further defect analysis.

Figure 9:
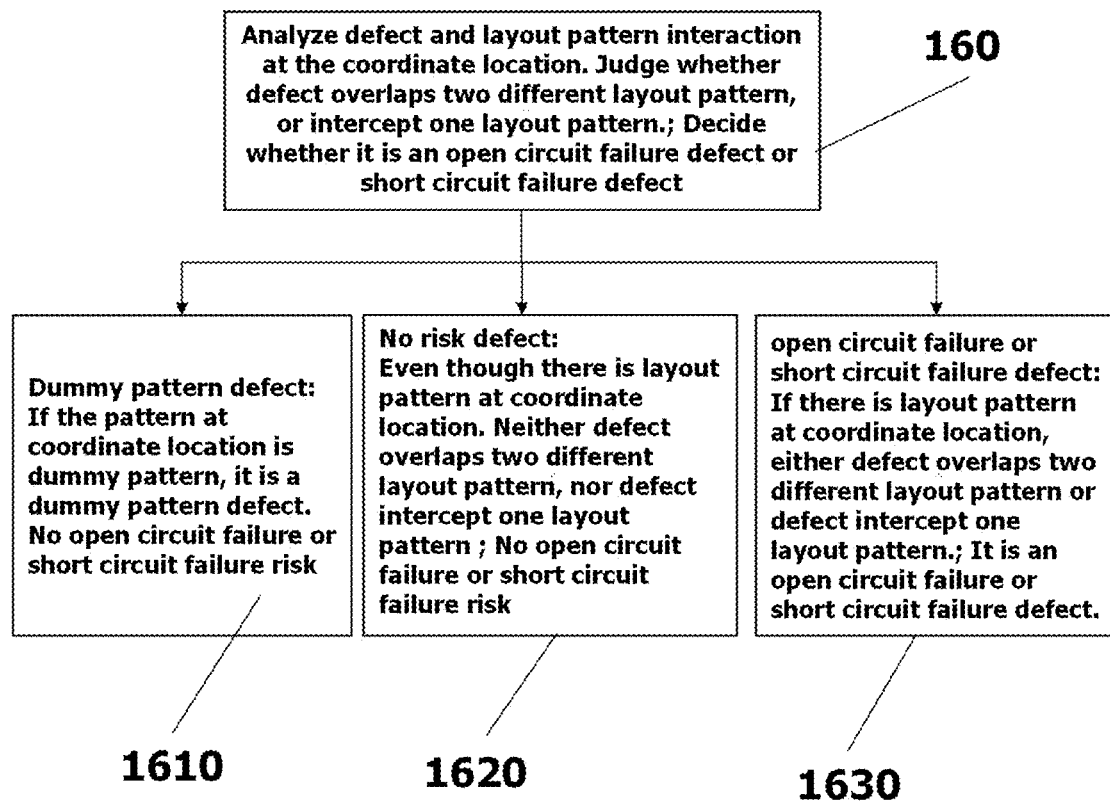
FIG. 9 is the execute pattern match between defect contour and polygon pattern flowchart for the smart system of the present invention.

Besides, please refer to FIG. 9, FIG. 9 shows a flowchart to execute the pattern match analysis between defect contour, defect image, and design layout pattern polygon. As shown in FIG. 9, step 160 is performed to execute the pattern match analysis between defect contour, defect image, and design layout pattern polygon and judge whether there is a short failure defect or open failure defect. Then, defect is classified. As shown in step 1610: If there is either no circuit pattern 1113 or dummy pattern inside the coordinate deviation region where the center of coordinate deviation region is the defect image 1101 mapped at the defect layout pattern 1111. Since there is no short failure or open failure possibility, the judgment is a dummy pattern defect. Dummy pattern defect, as shown in FIG. 1E, is categorized as a non-killer defect. Next, it is shown in step 1620. If there is circuit pattern 1113 inside the coordinate deviation region where the center of coordinate deviation region is the defect image 1101 mapped at the defect layout pattern 1111. From the pattern match analysis between defect contour, defect image, and design layout pattern polygon of step 160, there is no short failure or open failure possibility. It is judged to be a nuisance defect. As shown in FIG. 11F, only a circuit layout pattern 1113 located at one side of the defect layout pattern 1111. The defect will not cause short failure or open failure in FIG. 11F. Nuisance defect, as shown in FIG. 11F, is categorized as a non-killer defect. Furthermore, it is shown in step 1630. If there is circuit pattern 1113 inside the coordinate deviation region where the center of coordinate deviation region is the defect image 1101 mapped at the defect layout pattern 1111. From the pattern match analysis between defect contour and design layout pattern polygon of step 160, there is short failure or open failure possibility. It is judged to be a short defect or open defect. As shown in FIG. 7D, short defect or open defect is categorized as a killer defect.

Figure 10:
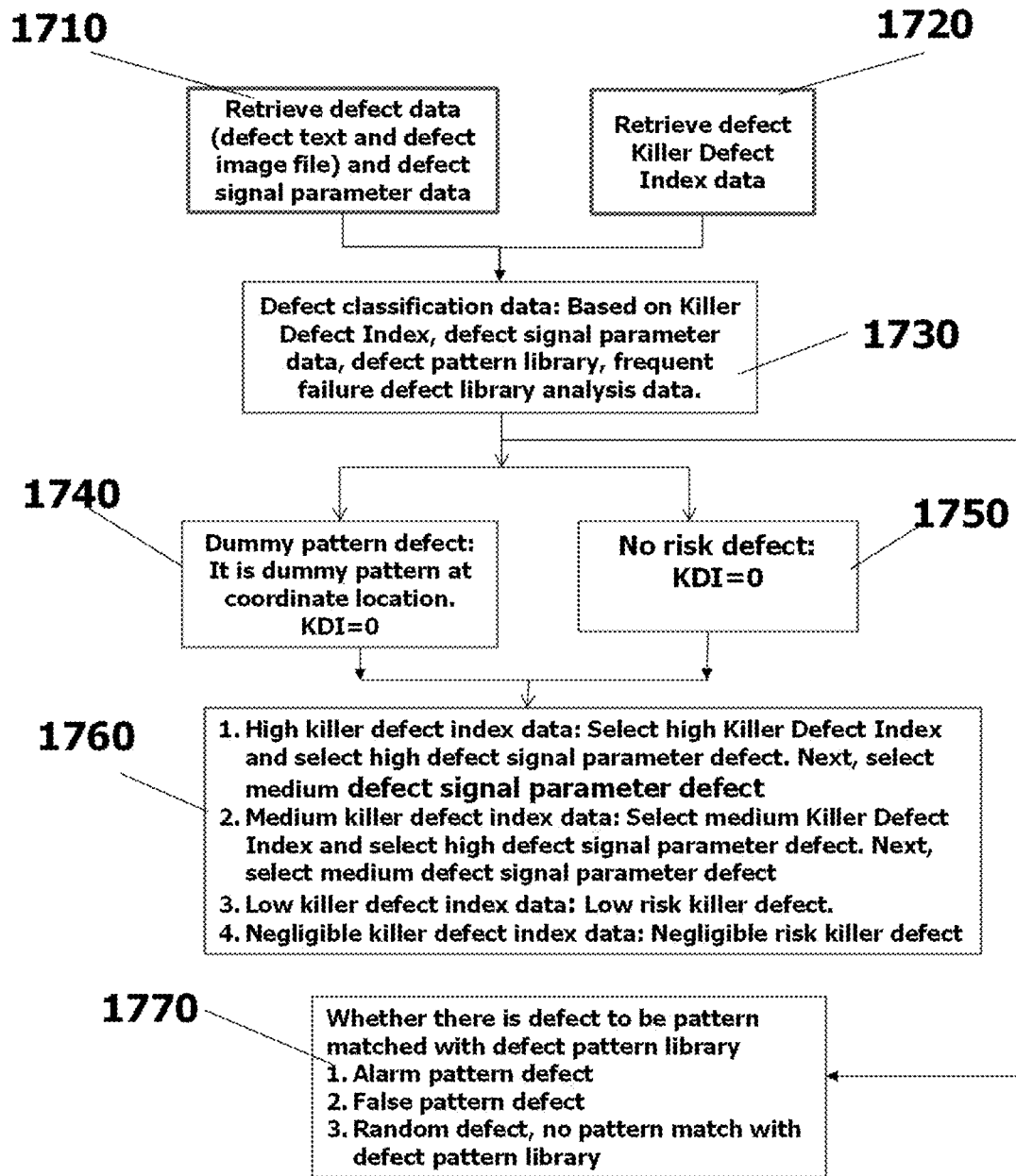
FIG. 10 is the defect classification flowchart for the smart system of the present invention.

Please refer to FIG. 10. It is a defect classification flowchart of the present invention. Obtain defect signal parameter data and KDI data as shown in FIG. 10. Based on KDI value and defect signal parameter value of each defect, and whether the defect matches defect pattern in defect pattern library and frequent failure defect library, the defect is classified as Non-killer defect and Killer defect. It is a criterion used for defect sample selection. In step 1710, it is to retrieve defect data and the defect signal parameter data after image processing analysis. In step 1720, it is to retrieve KDI data that is from Critical Area Analysis method in step 150 process. In step 1730, it is to classify defect based on KDI value and defect signal parameter value of each defect, and whether the defect matches defect pattern in defect pattern library and frequent failure defect library. Please reference defect pattern library from FIG. 11A to 11G. In step 1740, it is to judge whether there is possibility of either open circuit type failure or short circuit type failure. For example: When KDI value of a defect is equal to 0. No matter how much the defect signal parameter value (as shown in FIG. 11A) is, it is judged as a dummy pattern defect (as shown in FIG. 11E). It is classified as Non-killer defect. The defect will be filtered. That means the Non-killer defect is not considered in the defect sample selection analysis. For example: There are 5000 defects in defect image file 1101. 3000 defects are Non-killer defect. During defect sample selection analysis, those 3000 Non-killer defects are not considered for defect sample selection. In step 1750, it is to judge a KDI value to be equal to 0 or close to 0. No matter how much the defect signal parameter value, it is judged as a Nuisance defect (as shown in FIG. 11F). It is classified as Non-killer defect. The defect will be filtered as well. The filter procedure is same as in step 1740. It is not repeated here.

Next, implement step 1760. First, it is to do defect classification for those defects not filtered from previous step. For example: Select high KDI value defect (For example: KDI value 0.75~1) and high defect signal parameter value as first priority defect sample selection group. After that, select high KDI value defect (For example: KDI value 0.75~1) and medium defect signal parameter value as second priority defect sample selection group. The next is to select medium KDI value defect (For example: KDI value 0.5~0.75) and high defect signal parameter value as third priority defect sample selection group. Next, select medium KDI value defect (For example: KDI value 0.5~0.75) and medium defect signal parameter value as fourth priority defect sample selection group. To be mentioned here, all the above groups belong to high-risk killer defect sample selection group. It is under high priority to monitor if any further process, equipment problem must be fixed, or layout pattern must be modified. If there is time limitation, user can select the first priority defect sample selection group to inspect the defect pattern closely. How to decide the defect sample selection group, the present invention does not put any limitation for defect sample selection.

Even more, select low KDI value defect (For example: KDI value 0.2~0.5) and high, medium defect signal parameter value as fifth or least priority defect sample selection group. Since low KDI value defect is a low-risk killer defect, it is only selected at minimum defect sample quantity or even selected occasionally. As to lowest KDI group defect (For example: KDI<0.2 and KDI>0), it is a negligible risk killer defect. Since negligible risk killer defect approximate nuisance defect, it is close to Non-killer defect. So, there is no need to do defect sample selection for negligible risk killer defect. The negligible risk killer defect will be filtered as well. Those procedures mentioned above already implements defect classification and defect sample selection group for all the defect image 1101 on wafer 10. So, those defect classification and defect sample selection result will be recorded into defect text and image data file 1130 with more result data added (as shown in FIG. 3B, more column of defect information is added). Each defect image 1101 is marked what defect classification group and defect sample selection priority group the defect belongs to. Of course, the added defect information in the defect text and image file 1130 will be updated and stored into memory unit 31.

Besides, it is shown in step 1770. After finishing defect classification in step 1730 and perform pattern match with defect pattern library and frequent failure defect library. If there is identical or similar defect pattern and the defect pattern is a alarm defect pattern, then the defect must be sampled at defect sample selection procedure. On the other hand, the defect will be filtered if the defect pattern is a false defect layout pattern (as shown in FIG. 11G).

Smart defect calibration system and the method thereof of the present invention utilize defect coordinate calibration system and defect size calibration system to improve the Critical Area Analysis precision level for defect analysis. That raises the killer defect judgment precision level when open circuit failure or short circuit failure probability of semiconductor defect can be judged correctly. The non-killer defect will be filtered and excluded in defect sample selection procedure. Combine KDI data and defect signal parameter data to setup killer defect and its risk classification level as defect sample selection priority sequence. Comparing to traditional defect sample selection standard based on defect signal intensity and defect size dimension criteria, the present invention increases the discovery of real open circuit failure killer defect or short circuit failure killer defect in much better capability. It will shorten defect yield learning curve time and raise to higher wafer yield as well. Ramp production at earlier time will increase revenue. Wafer yield increase reduces cost.

Although specific embodiments have been illustrated and described, it will be appreciated by those skilled in the art that various modifications may be made without departing from the scope of the present invention, which is intended to be limited solely by the appended claims.

What is claimed is:

1. A method for smart conversion and calibration of coordinate by means of a coordinate conversion and calibration system including a data processing apparatus and a storage apparatus, the method comprising following steps:

providing an integrated circuit design layout file, the integrated circuit design layout file has a plurality of circuit layout patterns and is stored into the storage apparatus;

processing a wafer fabrication process, a semiconductor manufacturing fab forms the plurality of circuit layout patterns on the wafer according to the integrated circuit design layout file;

processing a wafer defect scan and inspection by a defect inspection tool to obtain a defect inspection data, the data processing apparatus transforms the defect inspection data into a defect text and image data file and stores into the storage apparatus, wherein the defect text and image data file includes a plurality of defect data on the wafer, and each of the defect data at least includes a defect coordinate, a defect size, a defect area and a defect intensity value of a defect contour;

retrieving an original coordinate, an alignment reference coordinate, and a dimension unit data of the circuit layout pattern and the defect inspection tool from the storage apparatus;

adjusting dimension units of the defect size, a defect coordinate and the circuit layout pattern to be the same dimension unit by the data processing apparatus;

converting the defect contour onto a correct defect coordinate $(X_2, Y_2)$ of the circuit layout pattern for a real-time pattern match by the data processing apparatus;

executing a coordinate deviation calibration by the data processing apparatus, which includes:

performing a manual pattern match by a user to measure the coordinate deviation calibration value $(X_2'-X_2, Y_2'-Y_2)$, by adjusting the dimension unit of a displayed defect layout pattern and the defect contour to be the same, and manually marking the defect contour location to the corresponding location in the circuit layout pattern as a new coordinate location $(X_2', Y_2')$, wherein the manual pattern match means that the coordinate deviation calibration is accomplished via a mouse cursor manually marking the defect coordinate corresponding to the location in the circuit layout pattern as the new coordinate location $(X_2', Y_2')$;

performing a pattern match using a Graphical User Interface by a user to measure the coordinate deviation calibration value $(X_2'-X_2, Y_2'-Y_2)$, and to mark the defect contour location to the corresponding location in the circuit layout pattern as the new coordinate location $(X_2', Y_2')$, wherein the user moves a mouse cursor to mark the defect contour location at the defect text and image data file mapped to the corresponding location in the circuit layout pattern as the new coordinate location $(X_2', Y_2')$, then the defect coordinate $(X_1, Y_1)$ is converted to the correct defect coordinate $(X_2, Y_2)$;

performing an auto pattern match between the defect contour in the circuit layout pattern and the defect contour in the defect text and image data file by the data processing apparatus to measure the coordinate deviation calibration value $(X_2'-X_2, Y_2'-Y_2)$, and to mark the defect contour location to the corresponding location in the circuit layout pattern as the new coordinate location $(X_2', Y_2')$;

obtaining a coordinate deviation calibration value $(X_2'-X_2, Y_2'-Y_2)$ by the data processing apparatus, the coordinate deviation calibration value $(X_2'-X_2, Y_2'-Y_2)$ includes an average coordinate precision value and a coordinate precision standard deviation value for X-axis and Y-axis, the average coordinate precision value and the coordinate precision standard deviation value are calculated via a statistical analysis;

introducing the average coordinate precision value and the coordinate precision standard deviation value into the coordinate conversion and calibration system in order to overlap or map a defect coordinate $(X_1, Y_1)$ to the new coordinate location $(X_2', Y_2')$ based on the coordinate deviation calibration value $(X_2'-X_2, Y_2'-Y_2)$ after the coordinate deviation calibration wherein if the correct defect coordinate $(X_2, Y_2)$ in a converted defect layout pattern is not at the same location with the new coordinate location $(X_2', Y_2')$ in the defect contour, the coordinate deviation calibration must be performed to calibrate the new coordinate location $(X_2', Y_2')$;

executing an overlapping procedure by the data processing apparatus, the data processing apparatus overlaps the defect size and the defect area onto the coordinate deviation calibration value $(X_2'-X_2, Y_2'-Y_2)$ at a coordinate deviation area of the circuit layout pattern based on the corresponding defect coordinate after the conversion and calibration of coordinate; and executing a Critical Area Analysis (CAA) by the data processing apparatus, based on the overlapping of the calibrated defect size and defect area onto the mapped circuit layout pattern, the data processing apparatus uses the CAA to analyze a critical area within the coordinate deviation area for each of the defects, and decides a Killer Defect Index (KDI) value.

2. The method of claim 1, wherein the coordinate deviation calibration includes a pattern match using a Graphical User Interface by a user to measure the coordinate deviation calibration value $(X_2'-X_2, Y_2'-Y_2)$, and to mark the defect contour location to the corresponding location in the circuit layout pattern as the new coordinate location $(X_2', Y_2')$.

3. The method of claim 2, wherein the pattern match using a Graphical User Interface means that the user moves a mouse cursor to mark the defect contour location at the defect text and image data file mapped to the corresponding location in the circuit layout pattern as the new coordinate location $(X_2', Y_2')$, then the defect coordinate $(X_1, Y_1)$ is converted to the correct defect coordinate $(X_2, Y_2)$.

4. The method of claim 1, wherein after the CAA, the method further comprises classifying each of the defects based on the KDI value of each defect and the defect intensity value of the defect contour, and executing a defect sample selection based on defect classification result by the data processing apparatus in order to detect whether cause an open circuit failure or a short circuit failure or not.

5. A method for smart conversion and calibration of coordinate by means of a coordinate conversion and calibration system including a data processing apparatus and a storage apparatus, the method comprising following steps:

providing an integrated circuit design layout file, the integrated circuit design layout file has a plurality of circuit layout patterns and is stored into the storage apparatus;

processing a wafer fabrication process, a semiconductor manufacturing fab forms the plurality of circuit layout patterns on the wafer according to the integrated circuit design layout file;

processing a wafer defect scan and inspection by a defect inspection tool to obtain a defect inspection data, the data processing apparatus transforms the defect inspection data into a defect text and image data file and stores into the storage apparatus, wherein the defect text and image data file includes a plurality of defect data on the wafer, and each of the defect data at least includes a defect coordinate, a defect size, a defect area and a defect intensity value of a defect contour;

retrieving an original coordinate, an alignment reference coordinate, and a dimension unit data of a mask, the circuit layout pattern and the defect inspection tool from the storage apparatus;

adjusting dimension units of the defect size, the defect coordinate, the mask and the circuit layout pattern to be the same dimension unit by the data processing apparatus;

converting the defect contour onto a correct defect coordinate $(X_2, Y_2)$ of the circuit layout pattern for a real-time pattern match by the data processing apparatus;

executing a coordinate deviation calibration by the data processing apparatus, which includes:

performing a manual pattern match by a user to measure the coordinate deviation calibration value $(X_2'-X_2, Y_2'-Y_2)$, by adjusting the dimension unit of a displayed defect layout pattern and the defect contour to be the same, and manually marking the defect contour location to the corresponding location in the circuit layout pattern as a new coordinate location $(X_2', Y_2')$, wherein the manual pattern match means that the coordinate deviation calibration is accomplished via a mouse cursor manually marking the defect coordinate corresponding to the location in the circuit layout pattern as the new coordinate location $(X_2', Y_2')$;

performing an auto pattern match between the defect contour in the circuit layout pattern and the defect contour in the defect text and image data file by the data processing apparatus to measure the coordinate deviation calibration value $(X_2'-X_2, Y_2'-Y_2)$, and to mark the defect contour location to the corresponding location in the circuit layout pattern as the new coordinate location $(X_2', Y_2')$;

obtaining a coordinate deviation calibration value $(X_2'-X_2, Y_2'-Y_2)$ by the data processing apparatus, the coordinate deviation calibration value $(X_2'-X_2, Y_2'-Y_2)$ includes an average coordinate precision value and a coordinate precision standard deviation value for X-axis and Y-axis, the average coordinate precision value and the coordinate precision standard deviation value are calculated via a statistical analysis;

introducing the average coordinate precision value and the coordinate precision standard deviation value into the coordinate conversion and calibration system in order to overlap or map a defect coordinate $(X_1, Y_1)$ to the new coordinate location $(X_2', Y_2')$ based on the coordinate deviation calibration value $(X_2'-X_2, Y_2'-Y_2)$ after the coordinate deviation calibration wherein if the correct defect coordinate $(X_2, Y_2)$ in a converted defect layout pattern is not at the same location with the new coordinate location $(X_2', Y_2')$ in the defect contour, the coordinate deviation calibration must be performed to calibrate the new coordinate location $(X_2', Y_2')$;

executing an overlapping procedure by the data processing apparatus, the data processing apparatus overlaps the defect size and the defect area onto the coordinate deviation calibration value $(X_2'-X_2, Y_2'-Y_2)$ at a coordinate deviation area of the circuit layout pattern based on the corresponding defect coordinate after the conversion and calibration of coordinate; and executing a Critical Area Analysis (CAA) by the data processing apparatus, based on the overlapping of the calibrated defect size and defect area onto the mapped circuit layout pattern, the data processing apparatus uses the CAA to analyze a critical area within the coordinate deviation area for each of the defects, and decides a Killer Defect Index (KDI) value.

6. The method of claim 5, wherein the coordinate deviation calibration includes a pattern match using a Graphical User Interface by a user to measure the coordinate deviation calibration value $(X_2'-X_2, Y_2'-Y_2)$, and to mark the defect contour location to the corresponding location in the circuit layout pattern as the new coordinate location $(X_2', Y_2')$.

7. The method of claim 6, wherein the pattern match using a Graphical User Interface means that the user moves a mouse cursor to mark the defect contour location at the defect text and image data file mapped to the corresponding location in the circuit layout pattern as the new coordinate location $(X_2', Y_2')$, then the defect coordinate $(X_1, Y_1)$ is converted to the correct defect coordinate $(X_2, Y_2)$.

8. The method of claim 5, wherein after the CAA, the method further comprises classifying each of the defects based on the KDI value of each defect and the defect intensity value of the defect contour, and executing a defect sample selection based on defect classification result by the data processing apparatus in order to detect whether cause an open circuit failure or a short circuit failure or not.

* * * * *